United States Patent
Pandey et al.

(10) Patent No.: US 10,825,484 B2
(45) Date of Patent: Nov. 3, 2020

(54) INTEGRATED ASSEMBLIES WHICH INCLUDE NON-CONDUCTIVE-SEMICONDUCTOR-MATERIAL AND CONDUCTIVE-SEMICONDUCTOR-MATERIAL, AND METHODS OF FORMING INTEGRATED ASSEMBLIES

(71) Applicant: Micron Technology, Inc., Boise, ID (US)

(72) Inventors: Deepak Chandra Pandey, Uttarakhand (IN); Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/702,926

(22) Filed: Dec. 4, 2019

(65) Prior Publication Data

US 2020/0105311 A1    Apr. 2, 2020

Related U.S. Application Data

(63) Continuation of application No. 16/040,337, filed on Jul. 19, 2018, now Pat. No. 10,535,378.

(51) Int. Cl.
*G11C 5/10* (2006.01)
*H01L 27/108* (2006.01)
*G11C 11/401* (2006.01)

(52) U.S. Cl.
CPC .............. *G11C 5/10* (2013.01); *G11C 11/401* (2013.01); *H01L 27/10805* (2013.01); *H01L 27/10882* (2013.01)

(58) Field of Classification Search
CPC ..... C09K 11/06; H01L 51/5016; H01L 51/56; H01L 51/0072; H01L 51/5072
(Continued)

(56) References Cited

U.S. PATENT DOCUMENTS 9,754,946 B1   9/2017 Yang et al.
2006/0148134 A1*  7/2006 Hwang ............. H01L 27/10885
                                                                 438/118
(Continued)

OTHER PUBLICATIONS

WO PCT/US2019/025490 SR, Jul. 19, 2019, Search Report.
WO PCT/US2019/025490 WO, Jul. 19, 2019, Written Opinion.

*Primary Examiner* — Andy Huynh
(74) *Attorney, Agent, or Firm* — Wells St. John P.S.

(57) ABSTRACT

A method of forming an integrated assembly includes providing a construction having laterally-spaced digit-line-contact-regions and having intervening regions between the laterally-spaced digit-line-contact-regions; forming an expanse of non-conductive-semiconductor-material which extends across the digit-line-contact-regions and the intervening regions; a lower surface of the non-conductive-semiconductor-material being vertically-spaced from upper surfaces of the digit-line-contact-regions; forming openings extending through the non-conductive-semiconductor-material to the digit-line-contact-regions; forming conductive-semiconductor-material-interconnects within the openings and coupled with the digit-line-contact-regions, upper surfaces of the conductive-semiconductor-material-interconnects being beneath the lower surface of the non-conductive-semiconductor-material; and forming metal-containing-digit-lines over the non-conductive-semiconductor-material.

27 Claims, 30 Drawing Sheets

(58) Field of Classification Search
USPC .......................................................... 257/296
See application file for complete search history.

(56) References Cited

U.S. PATENT DOCUMENTS

| | | | |
|---|---|---|---|
| 2007/0049041 A1* | 3/2007 | Rana ..................... | C09K 13/08 |
| | | | 438/736 |
| 2007/0189057 A1 | 8/2007 | Cheng et al. | |
| 2012/0264280 A1 | 10/2012 | Seo et al. | |
| 2014/0175659 A1* | 6/2014 | Lee ..................... | H01L 21/7682 |
| | | | 257/773 |
| 2017/0358692 A1 | 12/2017 | Sun et al. | |
| 2018/0019245 A1 | 1/2018 | Yang et al. | |
| 2018/0083011 A1 | 3/2018 | Wang | |

\* cited by examiner

INTEGRATED ASSEMBLIES WHICH INCLUDE NON-CONDUCTIVE-SEMICONDUCTOR-MATERIAL AND CONDUCTIVE-SEMICONDUCTOR-MATERIAL, AND METHODS OF FORMING INTEGRATED ASSEMBLIES

CROSS REFERENCE TO RELATED APPLICATION

This patent resulted from a continuation application of U.S. patent application Ser. No. 16/040,337, filed Jul. 19, 2018, and the teachings of the application is incorporated herein by reference.

TECHNICAL FIELD

Integrated assemblies which include non-conductive-semiconductor-material and conductive-semiconductor-material, and methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

It is desirable to develop new methods for fabricating highly-integrated DRAM, and to develop new architectures fabricated with such methods.

BRIEF DESCRIPTION OF THE DRAWINGS

FIGS. 1 and 3 are diagrammatic cross-sectional top-down views; and FIGS. 2 and 4 are diagrammatic cross-sectional side views. The view of FIG. 1 is a diagrammatic top view. The view of FIG. 2 is along the lines 2-2 of FIGS. 1, 3 and 4. The view of FIG. 3 is along the lines 3-3 of FIGS. 2 and 4. The view of FIG. 4 is along the lines 4-4 of FIGS. 1, 2 and 3.

FIG. 5 is a diagrammatic top view; FIG. 6 is a diagrammatic cross-sectional side view along the lines 6-6 of FIGS. 5 and 7; and FIG. 7 is a diagrammatic cross-sectional side view along the lines 7-7 of FIGS. 5 and 6.

FIG. 8 is a diagrammatic top view; FIG. 9 is a diagrammatic cross-sectional side view along the lines 9-9 of FIGS. 8 and 10; and FIG. 10 is a diagrammatic cross-sectional side view along the lines 10-10 of FIGS. 8 and 9.

FIG. 11 is a diagrammatic top view; FIG. 12 is a diagrammatic cross-sectional side view along the lines 12-12 of FIGS. 11 and 13; and FIG. 13 is a diagrammatic cross-sectional side view along the lines 13-13 of FIGS. 11 and 12.

FIG. 14 is a diagrammatic top view; FIG. 15 is a diagrammatic cross-sectional side view along the lines 15-15 of FIGS. 14 and 16; and FIG. 16 is a diagrammatic cross-sectional side view along the lines 16-16 of FIGS. 14 and 15.

FIG. 17 is a diagrammatic top view; FIG. 18 is a diagrammatic cross-sectional side view along the lines 18-18 of FIGS. 17 and 19; and FIG. 19 is a diagrammatic cross-sectional side view along the lines 19-19 of FIGS. 17 and 18.

FIG. 20 is a diagrammatic top view; FIG. 21 is a diagrammatic cross-sectional side view along the lines 21-21 of FIGS. 20 and 22; and FIG. 22 is a diagrammatic cross-sectional side view along the lines 22-22 of FIGS. 20 and 21.

DETAILED DESCRIPTION OF THE ILLUSTRATED EMBODIMENTS

Some embodiments include methods of forming connections to digit-line-contact-regions. A non-conductive-semiconductor-material may be formed across a construction comprising the digit-line-contact-regions, and openings may be formed to extend through the non-conductive-semiconductor-material to the digit-line-contact-regions. Conductive-semiconductor-material may be formed within the openings, and recessed so that an upper level of the conductive-semiconductor-material is beneath a lower level of the non-conductive-semiconductor-material. Accordingly, dopant will not migrate from the conductive-semiconductor-material to the non-conductive-semiconductor-material. Subsequently, digit lines may be formed to extend across the non-conductive-semiconductor-material, and may be coupled with the conductive-semiconductor-material. Some embodiments include integrated assemblies having interconnects of conductive-semiconductor-material coupled with digit-line-contact-regions. The interconnects have upper surfaces beneath a lower surface of an expanse of non-conductive-semiconductor-material. Digit lines extend across the expanse and are coupled with the interconnects. Example embodiments are described below with reference to FIGS. 1-30.

Referring to FIGS. 1-4, a portion of an example construction 10 is illustrated. Such construction may be formed with any suitable methodology. The construction 10 may be an initial construction utilized for some of the embodiments described herein. The construction 10 is an example of an initial construction which may be utilized for some of the embodiments described herein, and it is to be understood that other constructions may be utilized alternatively to the construction 10.

The construction 10 includes a plurality of active regions 12 extending upwardly from a semiconductor base 14. Some of the active regions 12 are labeled as 12a-f so that they may be distinguished relative to one another, and relative to others of the active regions. All of the active regions 12 may be substantially identical to one another; with the term "substantially identical" meaning identical to within reasonable tolerances of fabrication and measurement. The active regions 12 are illustrated with dashed lines (phantom view) in FIG. 1 in order to indicate that they are under other materials.

Figure 1:
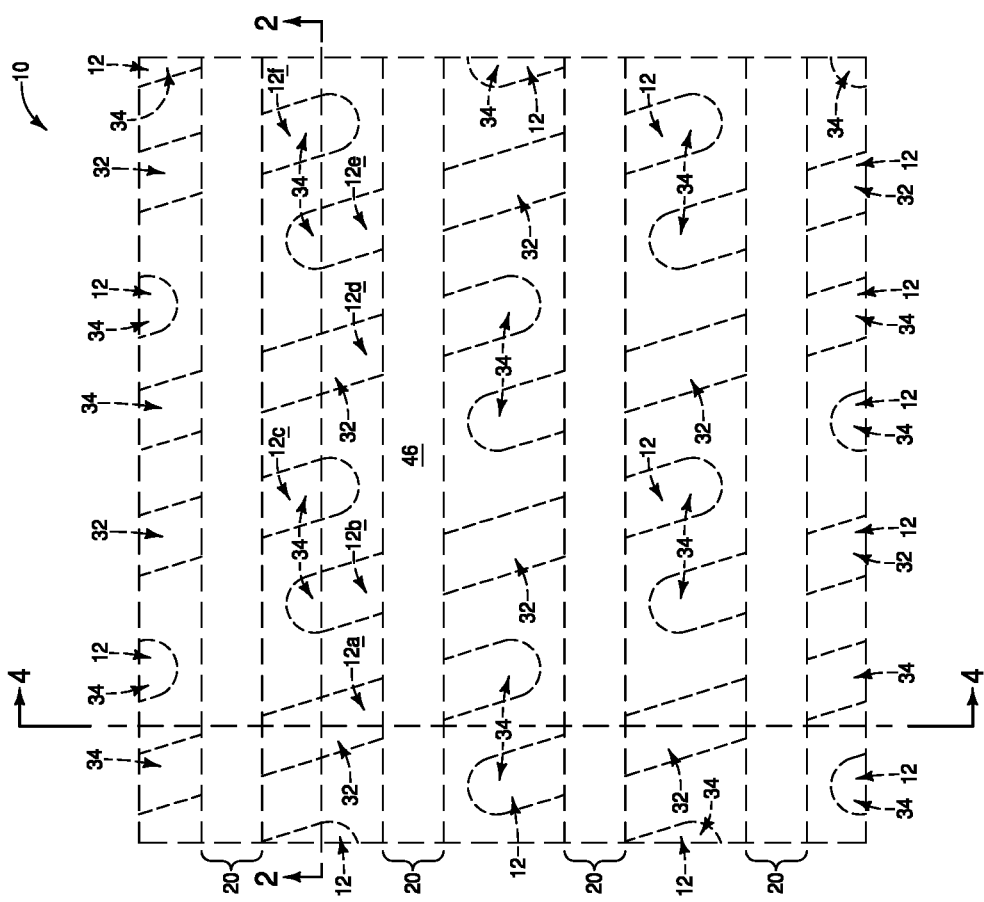
FIGS. 1-4 are diagrammatic views of a region of an example construction at an example initial process stage of an example method of forming an example integrated assembly.
Figure 2:
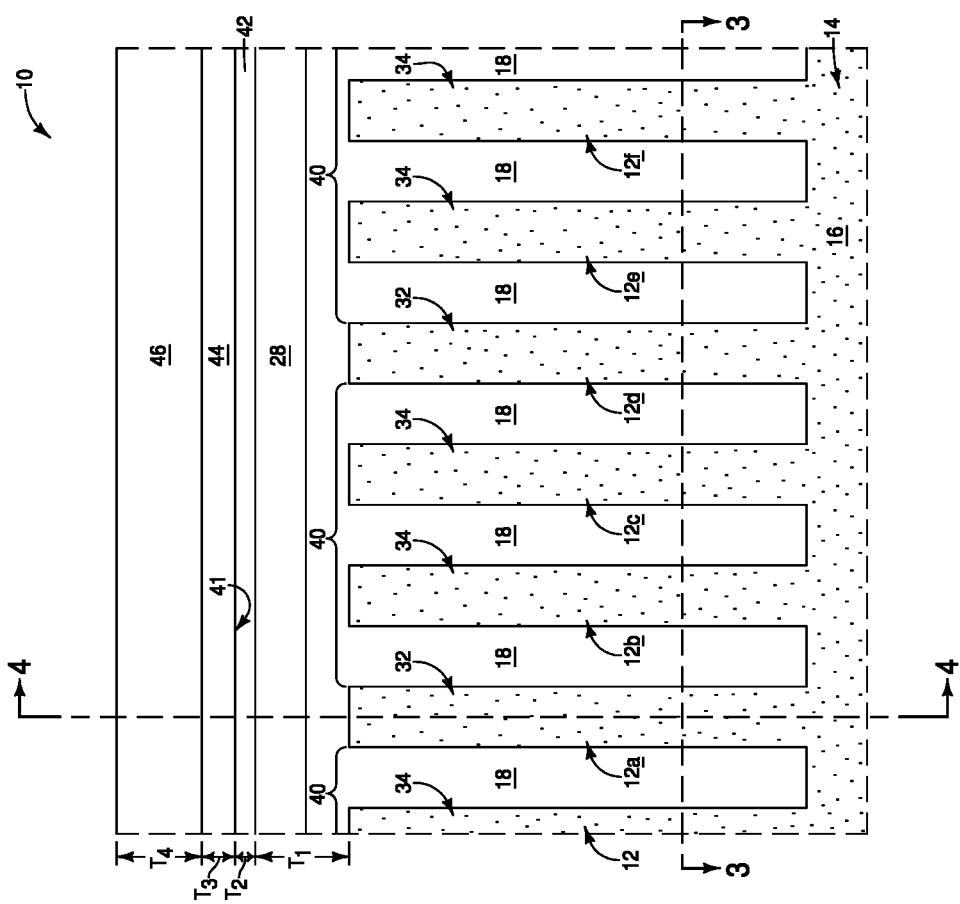
Figure 4:
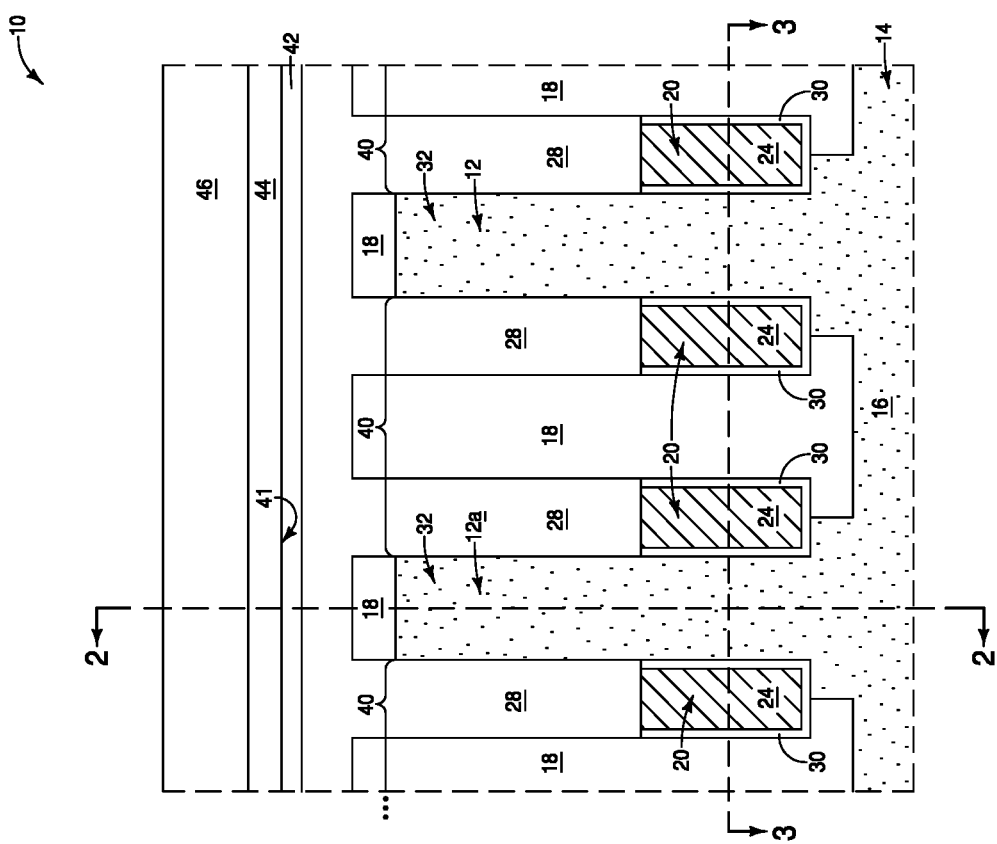

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon. In some embodiments, the semiconductor material 16 of the active regions may be referred to as active-region-material. Such active-region-material 16 is configured as pillars extending upwardly from the base 14, as shown in FIGS. 2 and 4.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions comprising insulative materials 18 and 28. The insulative material 18 may comprise any suitable composition or combination of compositions; and in some embodiments may comprise, consist essentially of, or consist of silicon dioxide. The insulative material 28 may comprise any suitable composition(s); and in some embodiments may comprise, consist essentially of, or consist of silicon dioxide and/or silicon nitride. The insulative 28 may be the same composition as the insulative material 18, or may be a different composition relative to the insulative material 18.

Figure 20:
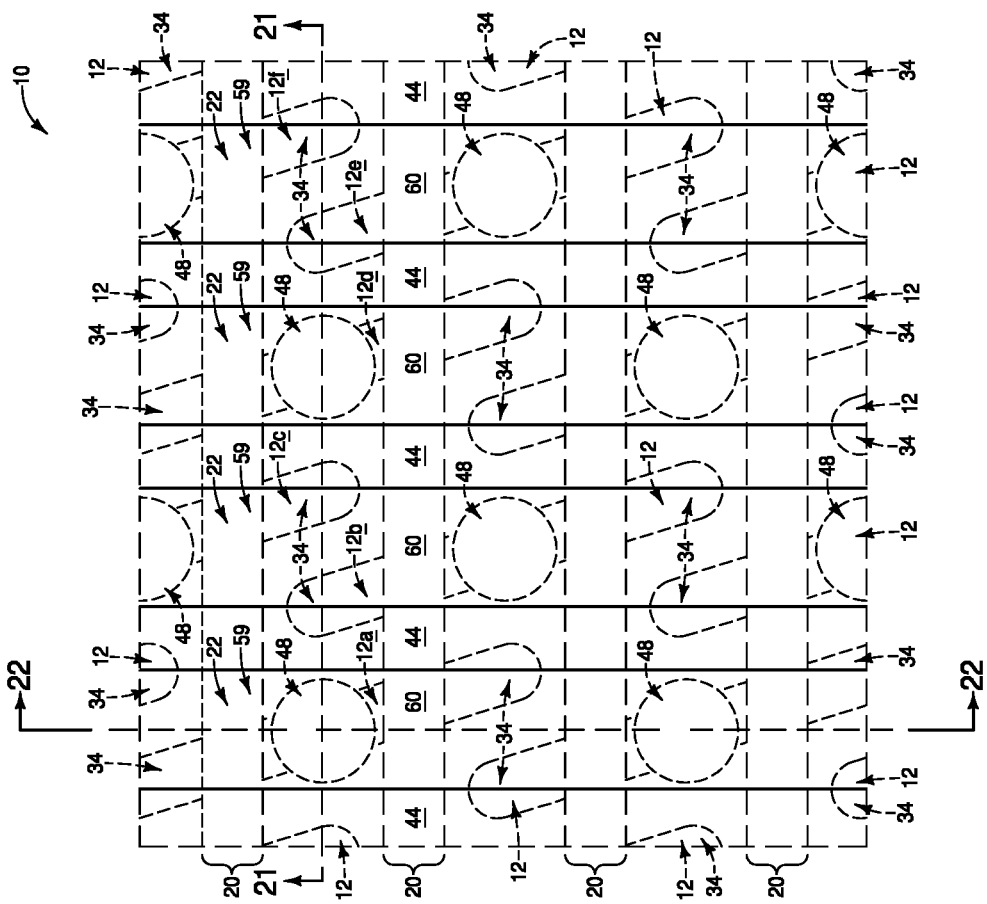
FIG. 20-22 are diagrammatic views of the region of the example construction of FIGS. 1-4 at an example processing stage subsequent to that of FIGS. 17-19.
Figure 21:
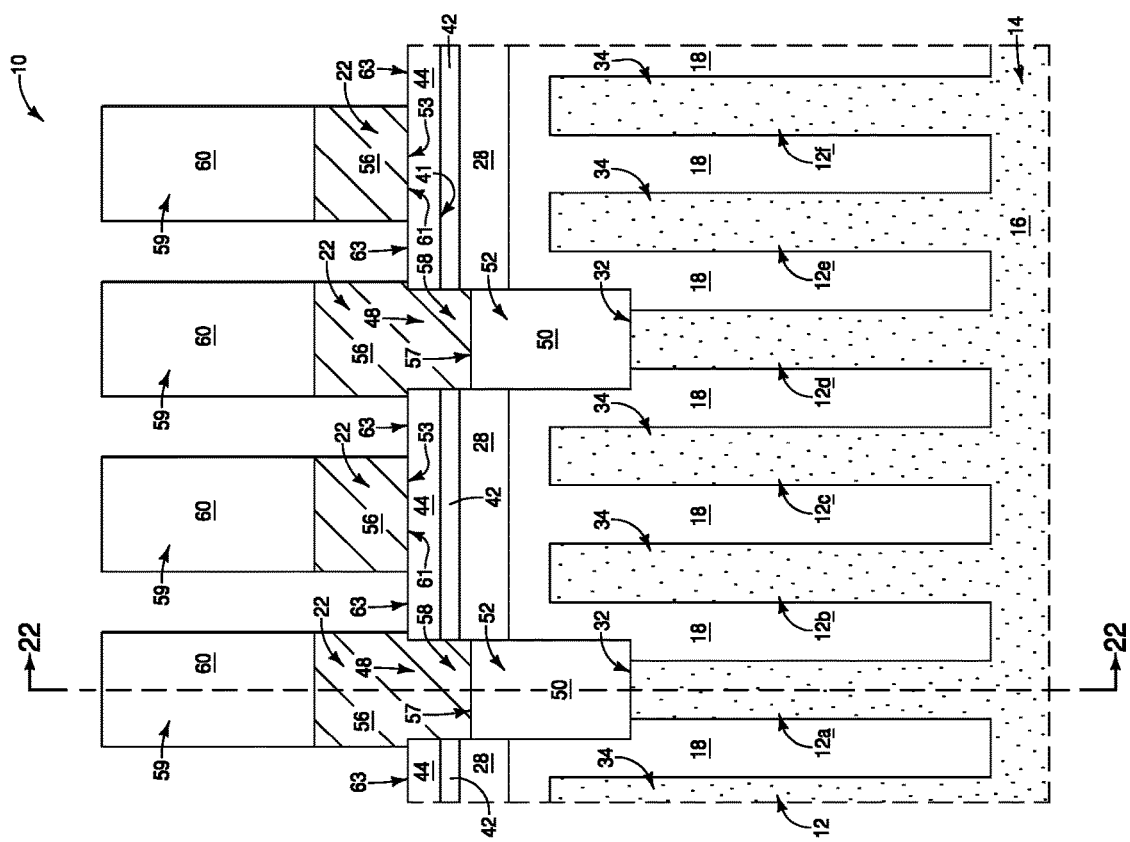
Figure 22:
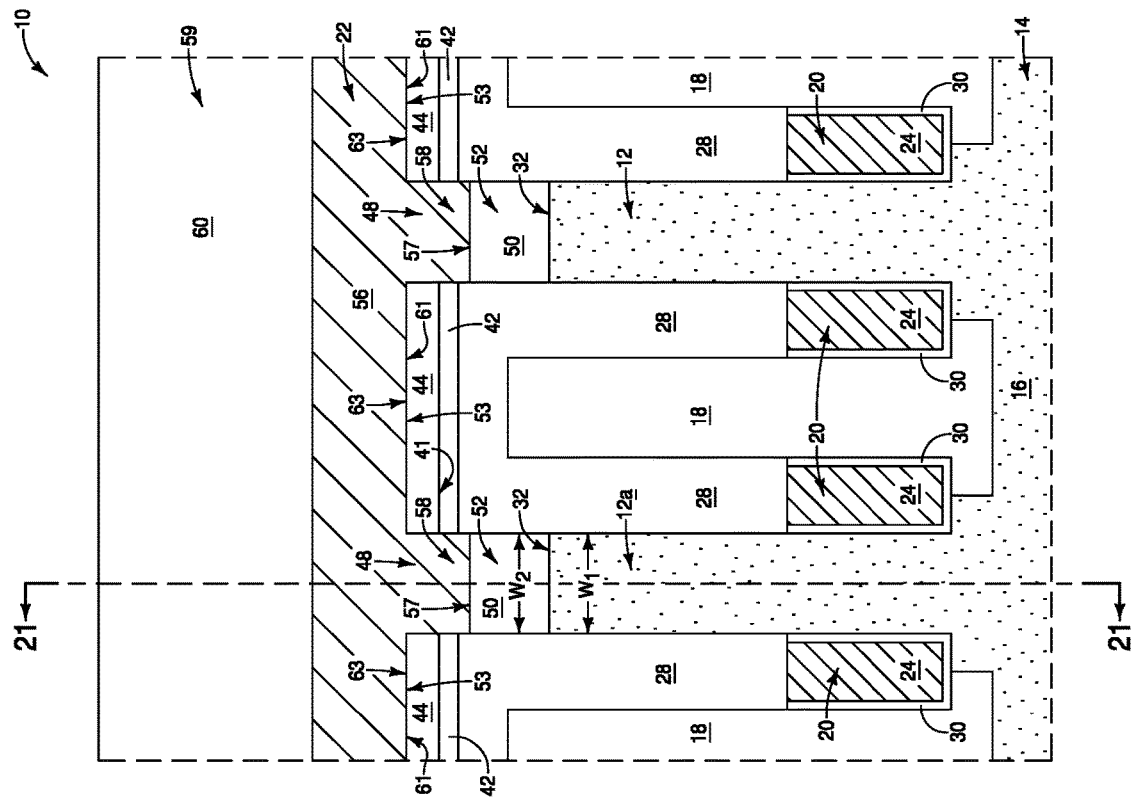

Wordlines (i.e., access lines) 20 extend along a first direction which may ultimately correspond to a row direction of a memory array. The wordlines 20 are illustrated with dashed lines (phantom view) indicated in FIG. 1 in order to indicate that they are under other materials. Digit lines (i.e., sense lines, bitlines) 22 will be formed with processing described herein (example digit lines 22 are shown in FIGS. 20-22), and such digit lines will extend along a second direction which may ultimately correspond to a column direction of the memory array.

The wordlines 20 comprise conductive material 24. The conductive material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The insulative material 28 is over the wordlines 20.

Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

Figure 3:
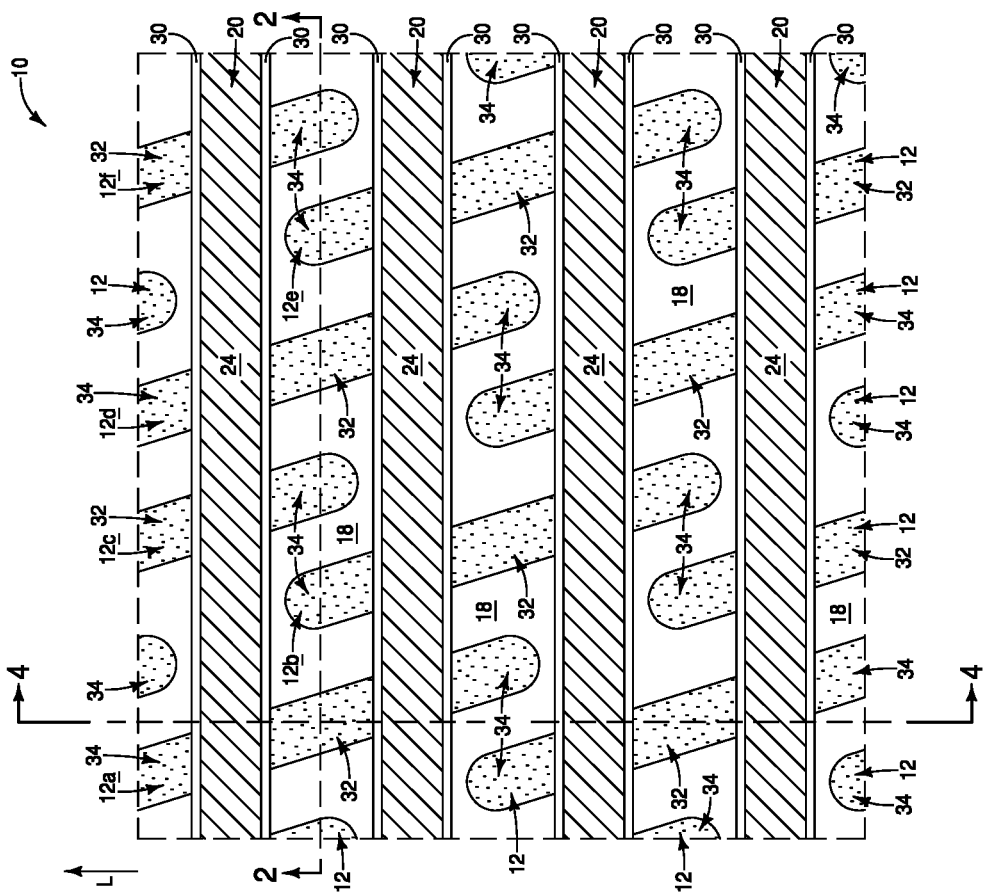

The wordlines 20 comprise transistor gates along the active regions 12. Each of the active regions may be considered to comprise a digit-line-contact-region 32, and a charge-storage-device-contact-region 34. The transistor gates electrically couple the digit-line-contact-regions with the charge-storage-device-contact-regions. The digit-line-contact-regions 32 and the charge-storage-device-contact-regions 34 are indicated in FIG. 3 to assist the reader in understanding the relative locations of the wordlines 20 relative to the digit-line-contact-regions 32 and the charge-storage-device-contact-regions 34. However, it is to be understood that the digit-line-contact-regions 32 and the charge-storage-device-contact-regions 34 are actually higher up on the active regions than the section of FIG. 3, as is indicated in FIGS. 2 and 4.

The digit-line-contact-regions 32 are eventually coupled with digit lines, and the charge-storage-device-contact-regions 34 are eventually coupled with charge-storage-devices (e.g., capacitors) as described in more detail below.

The digit-line-contact-regions 32 are laterally spaced from one another by intervening regions 40, as shown in FIGS. 2 and 4.

A first insulative material 42 is formed to extend across the digit-line-contact-regions 32, and across the intervening regions 40 between the digit-line-contact regions 32. The first insulative material 42 may comprise any suitable composition(s); and in some embodiments may comprise, consist essentially of, or consist of silicon nitride.

Non-conductive-semiconductor-material 44 is formed over the first insulative material 42. The non-conductive-semiconductor-material may comprise any suitable semiconductor composition(s); and in some embodiments may comprise, consist essentially of, or consist of one or more of silicon, germanium, III/V semiconductor material, semiconductor oxide, etc. In some embodiments, the non-conductive-semiconductor-material 44 may comprise, consist essentially of, or consist of silicon (e.g., polycrystalline silicon). Any level of doping within such material is too low to place the material in an electrically-conductive configuration, and accordingly the material is referred to as being non-conductive (i.e., electrically insulative). In some embodiments, the material 44 comprises silicon, and any concentration of conductivity-enhancing dopant within such material 44 is less than or equal to about $10^{15}$ atoms/cm$^3$ (i.e., no greater than about an intrinsic dopant level). In some embodiments, the material 44 may comprise polysilicon doped with substantially no impurities to indicate no conductivity; with the phrase "doped with substantially no impurities to indicate no conductivity" meaning that the material 44 is nonconductive. In some embodiments, the material 44 may comprise polysilicon doped with substantially no impurities to represent non-conductivity; with the phrase "doped with substantially no impurities to represent non-conductivity" meaning that the material 44 is nonconductive.

A second insulative material 46 is formed over the non-conductive-semiconductor-material 44. The second insulative material 46 may comprise any suitable composition(s); and in some embodiments may comprise, consist essentially of, or consist of silicon dioxide.

FIG. 2 diagrammatically illustrates example thicknesses $T_1$, $T_2$, $T_3$ and $T_4$ of various regions of materials across the example construction 10. In some example embodiments, the thickness $T_1$ (i.e., the thickness between a bottom surface of the insulative material 42 and top surfaces of the active-material-regions 16) may be within a range of from about 10 angstroms (Å) to about 300 Å; the thickness $T_2$ of the first insulative material 42 may be within a range of from about 10 Å to about 300 Å; the thickness $T_3$ of the non-conductive-semiconductor-material 44 may be within a range of from about 30 Å to about 300 Å; and the thickness $T_4$ of the second insulative material 46 may be within a range of from about 5 nanometers (nm) to about 500 nm.

In some embodiments, the non-conductive-semiconductor-material 44 may be considered to be configured as an expanse which extends across the digit-line-contact-regions 32 and the intervening regions 40. Such expanse has a lower surface 41 which is vertically-spaced from upper surfaces of the digit-line-contact-regions 32. Such vertical spacing corresponds to the combined thicknesses $T_1$ and $T_2$.

Figure 5:
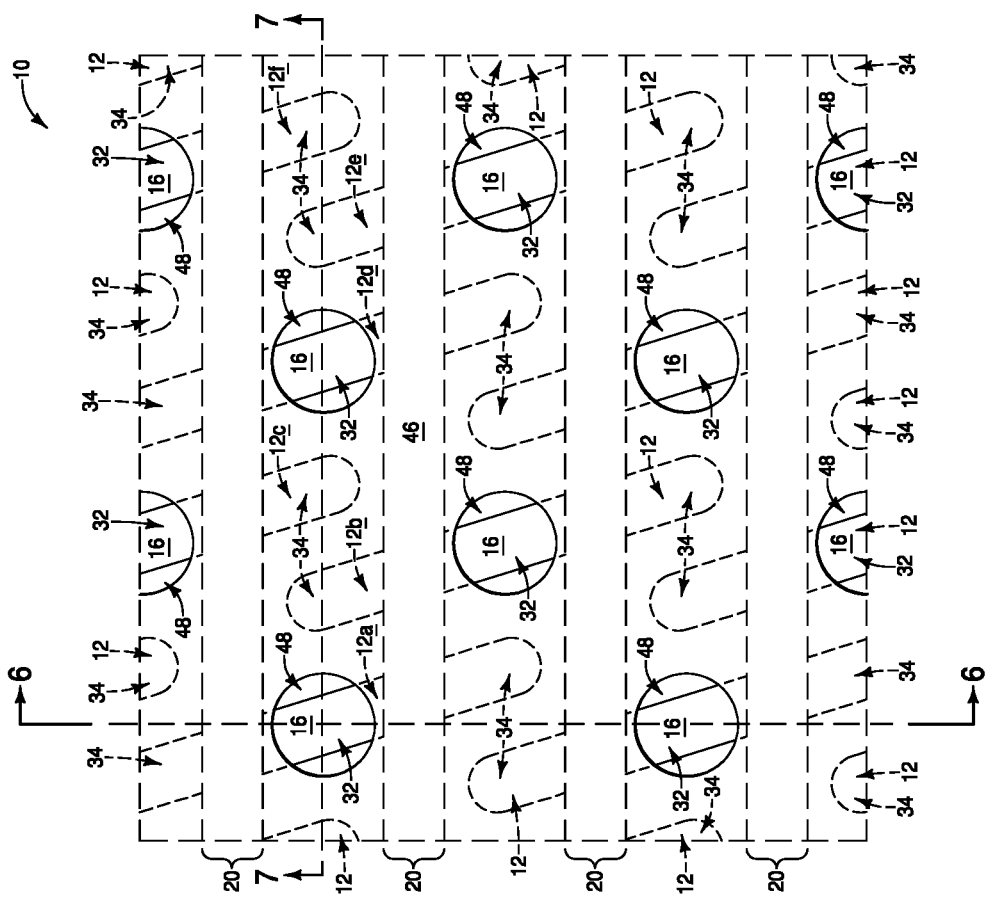
FIG. 5-7 are diagrammatic views of the region of the example construction of FIGS. 1-4 at an example processing stage subsequent to that of FIGS. 1-4.
Figure 6:
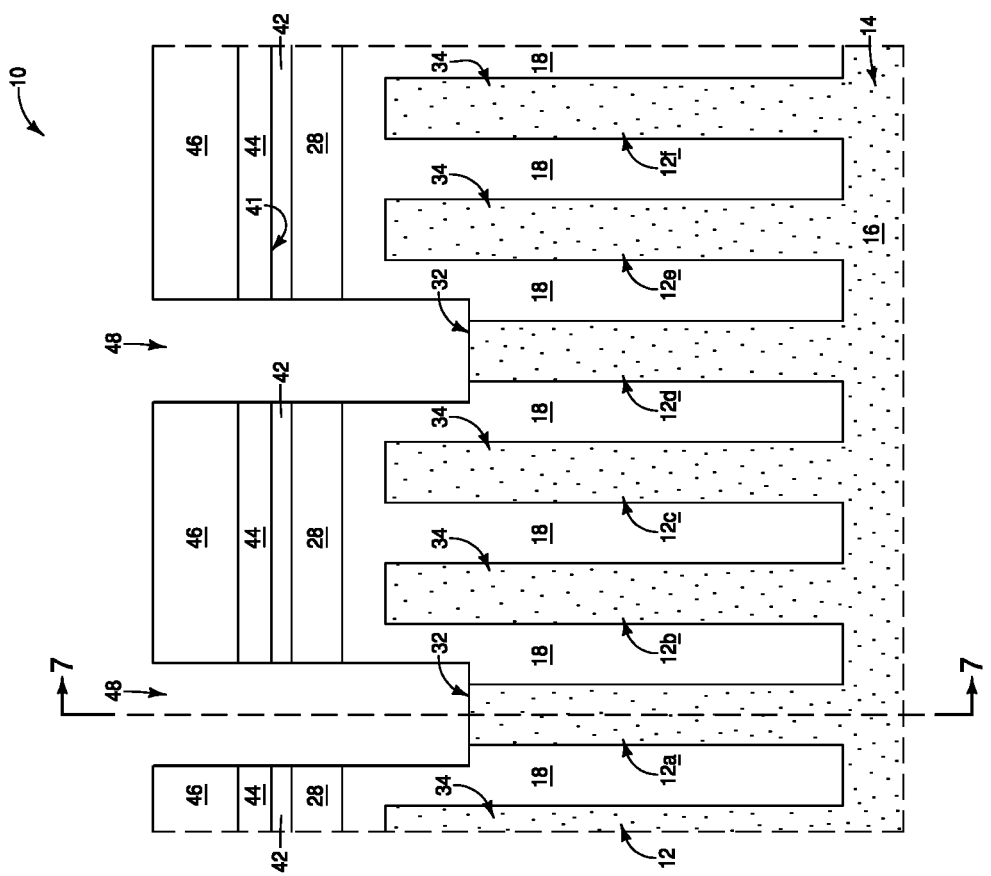
Figure 7:
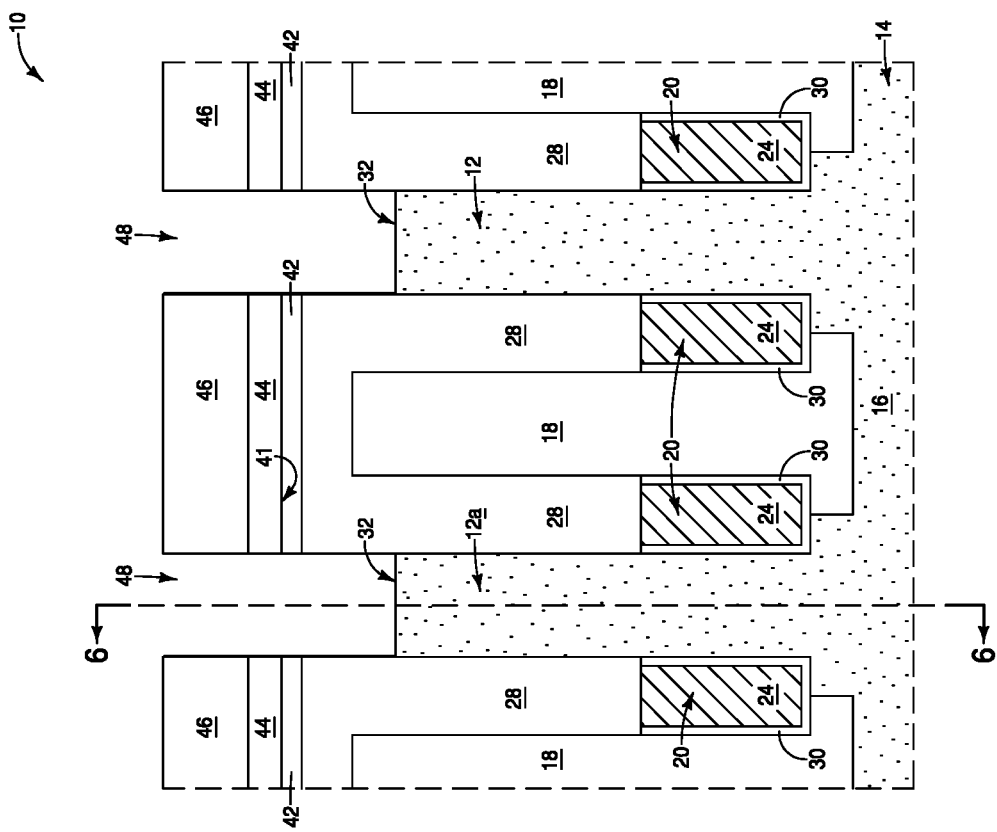

Referring to FIGS. 5-7, openings 48 are formed to extend through the second insulative material 46, the non-conductive-semiconductor-material 44, and the first insulative material 42; with such openings extending to the digit-line-contact-regions 32. The openings 48 may be patterned utilizing a mask (not shown) and any suitable etches.

Figure 8:
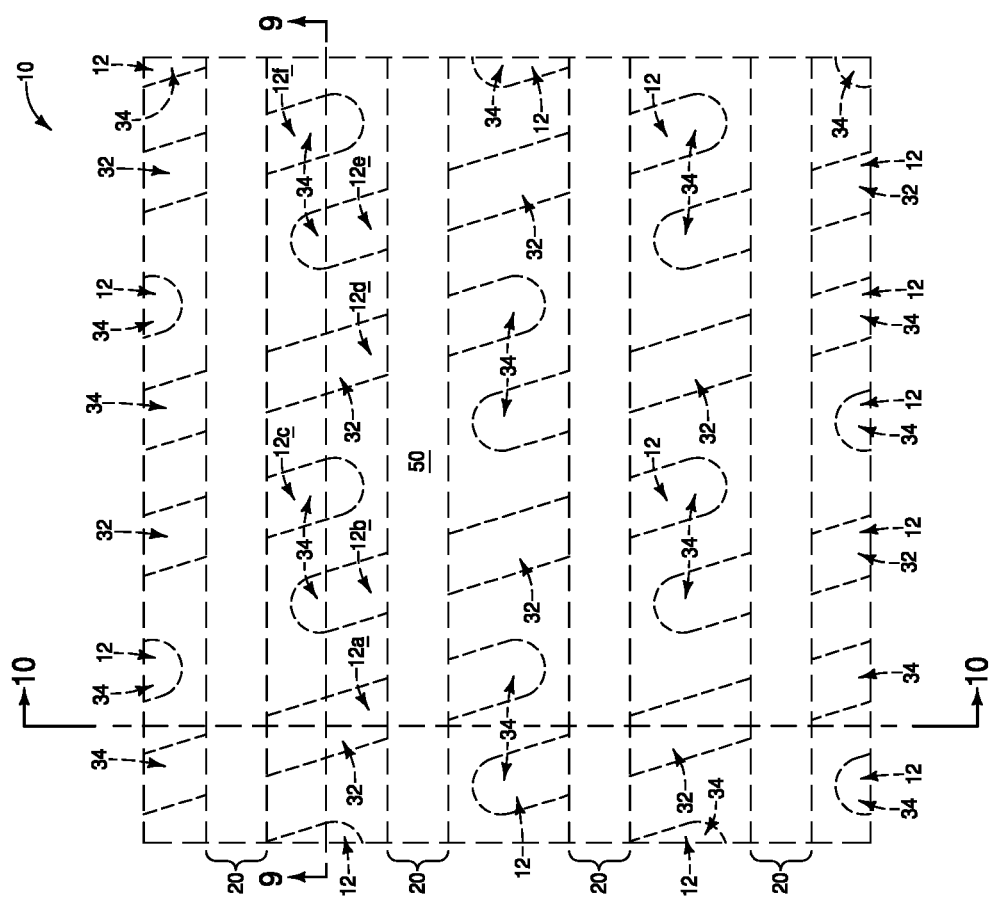
FIG. 8-10 are diagrammatic views of the region of the example construction of FIGS. 1-4 at an example processing stage subsequent to that of FIGS. 5-7.
Figure 9:
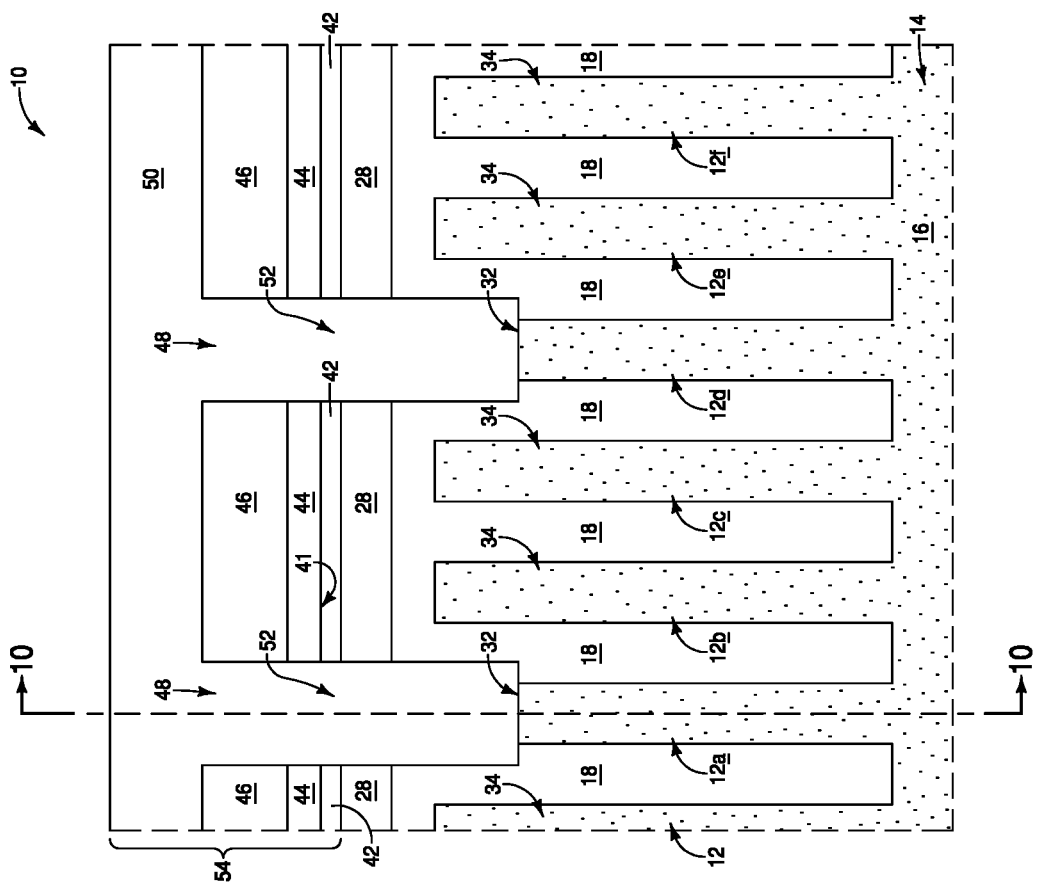
Figure 10:
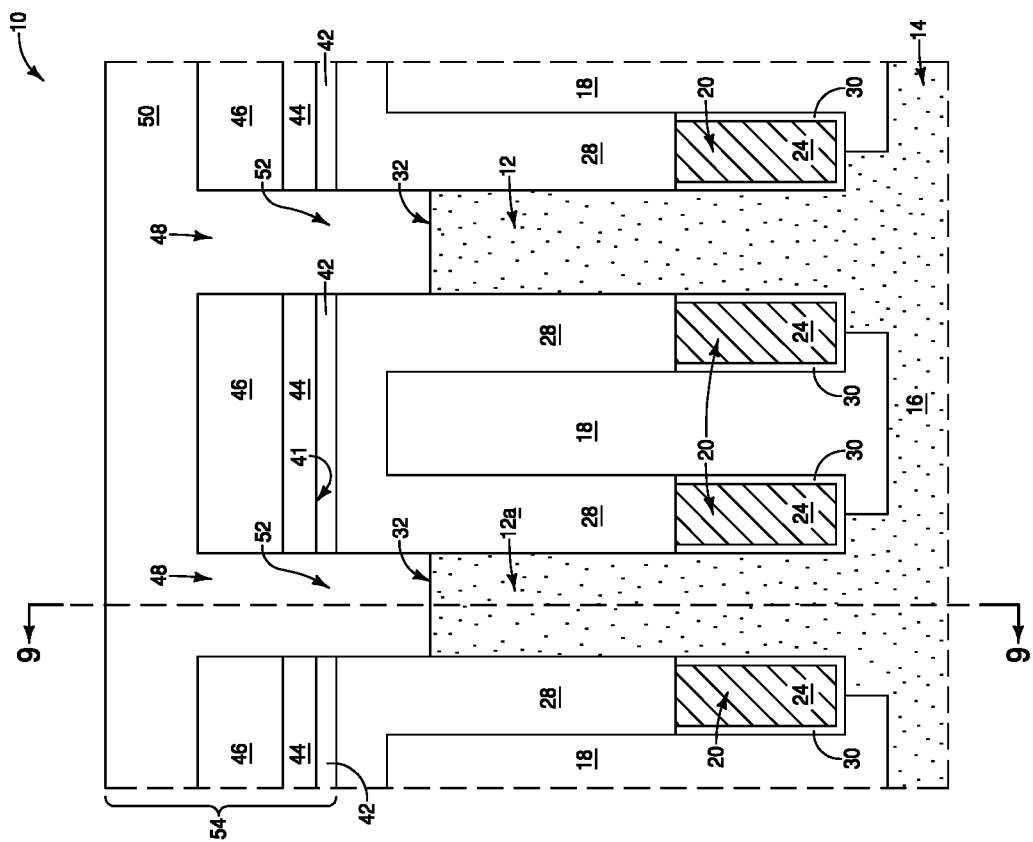

Referring to FIGS. 8-10, conductive-semiconductor-material 50 is formed over the second insulative material 46 and within the openings 48. The conductive-semiconductor-material 50 may comprise any suitable semiconductor composition(s); and in some embodiments may comprise, consist essentially of, or consist of one or more of silicon, germanium, III/V semiconductor material, semiconductor oxide, etc. In some embodiments, the conductive-semiconductor-material 50 may comprise, consist essentially of, or consist of silicon (e.g., polycrystalline silicon). The conductive-semiconductor-material 50 may comprise a same semiconductor composition as the non-conductive-semiconductor-material 44 in some embodiments (e.g., both may comprise, consist essentially of, or consist of silicon), and may comprise a different semiconductor composition relative to the non-conductive-semiconductor-material 44 in other embodiments.

The level of doping within the semiconductor material 50 is sufficient to place the material in an electrically-conductive configuration. In some embodiments, the material 50 comprises silicon, and the concentration of conductivity-enhancing dopant within such material 50 is at least about $10^{20}$ atoms/cm$^3$; and preferably at least about $10^{21}$ atoms/cm$^3$. In some embodiments, the material 50 may comprise polysilicon with impurities to indicate conductivity; with the phrase "with impurities to indicate conductivity" meaning that the material 50 is conductively doped. In some embodiments, the material 50 may comprise polysilicon with impurities to represent conductivity; with the phrase "with impurities to represent conductivity" meaning that the material 50 is conductively doped.

The conductive-semiconductor-material 50 within the openings 48 is electrically coupled with the digit-line-contact-regions 32. In the illustrated embodiment, the conductive-semiconductor-material 50 directly contacts the active-region-material 16 of the digit-line-contact-regions 32. In other embodiments, one or more electrically-conductive materials may be provided between the conductive-semiconductor-material 50 and the digit-line-contact regions 32.

The conductive-semiconductor-material 50 within the openings 48 may be considered to be configured as conductive-semiconductor-material-interconnects 52 which are electrically coupled with the digit-line-contact-regions 32.

Figure 11:
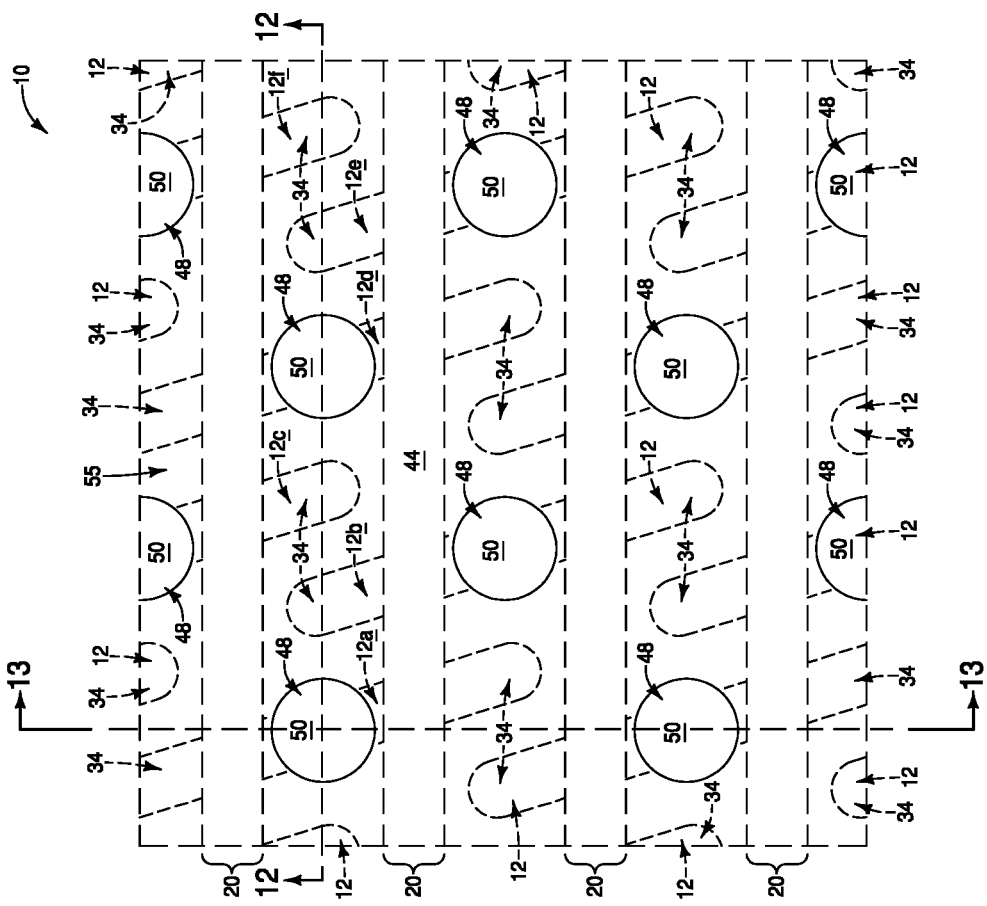
FIG. 11-13 are diagrammatic views of the region of the example construction of FIGS. 1-4 at an example processing stage subsequent to that of FIGS. 8-10.
Figure 12:
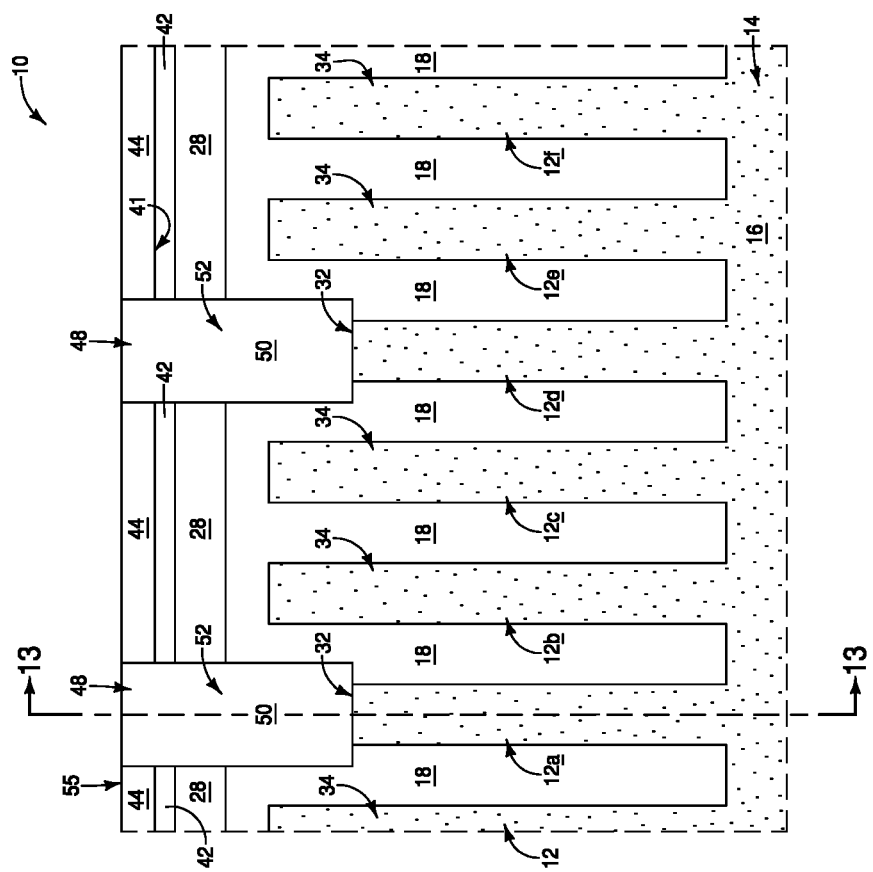
Figure 13:
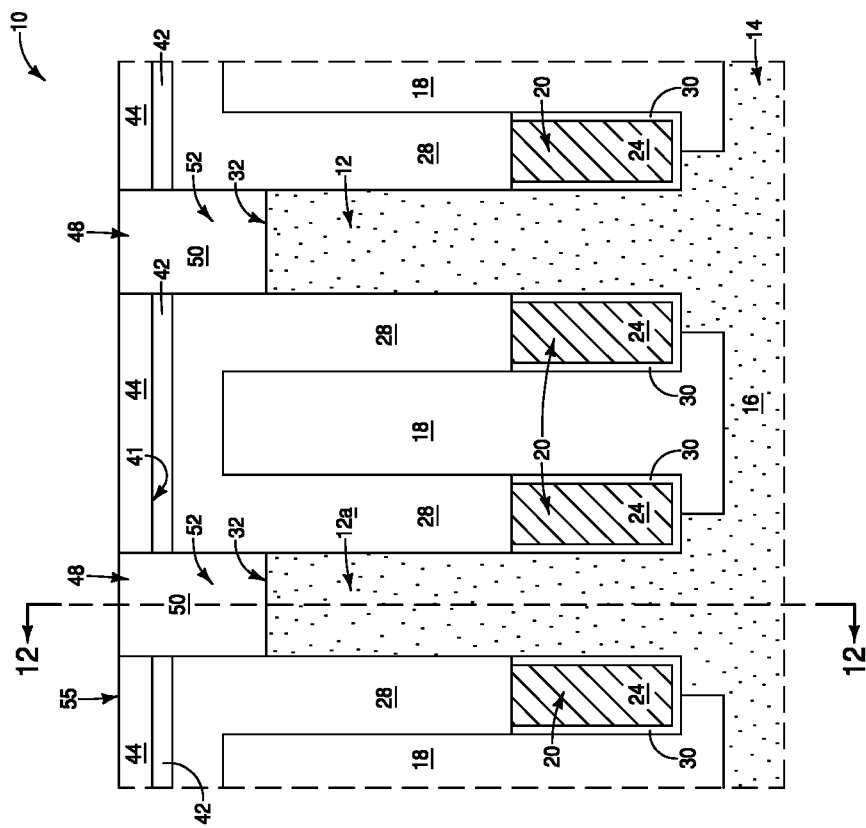

The materials 42, 44, 46 and 50 may be considered together to form a subassembly (or stack) 54. Such stack is subjected to a planarization process (e.g., chemical-mechanical polishing) to form a planarized upper surface 55 extending across the non-conductive-semiconductor-material 44 and the conductive-semiconductor-material 50, as shown in FIGS. 11-13. The planarization removes the second insulative material 46 (FIGS. 8-10), and removes some of the conductive-semiconductor-material 50.

Figure 14:
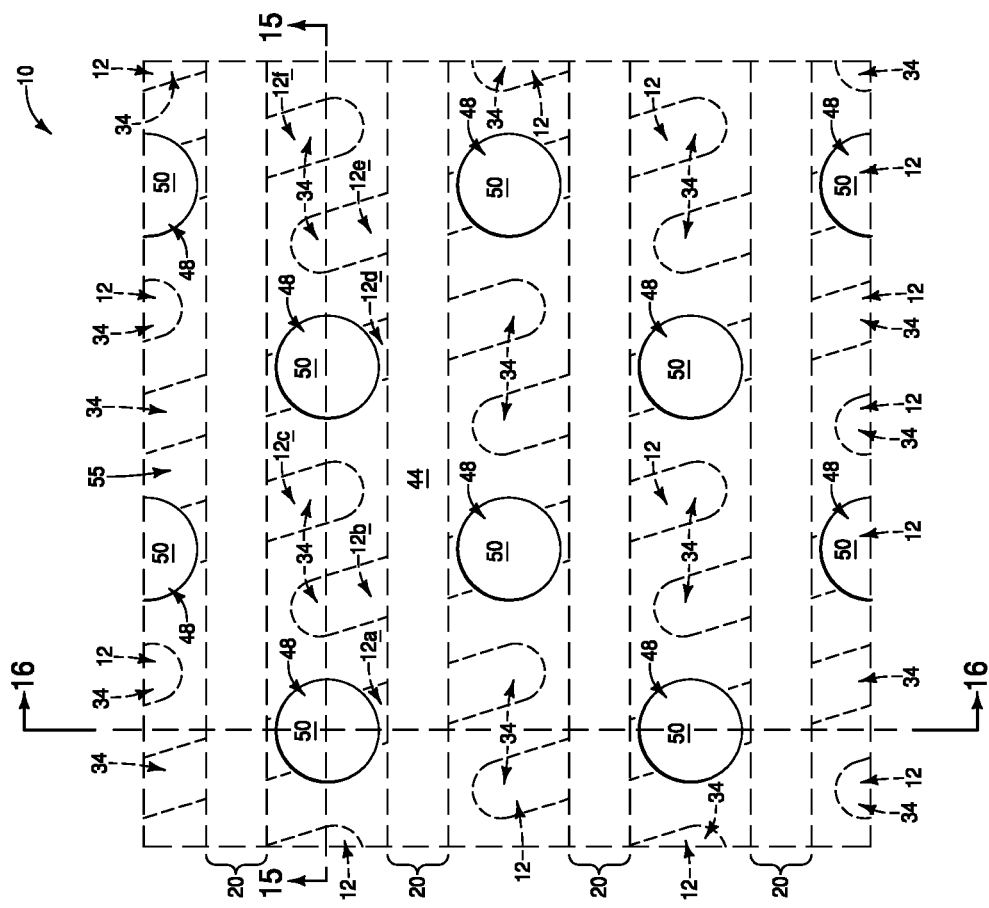
FIG. 14-16 are diagrammatic views of the region of the example construction of FIGS. 1-4 at an example processing stage subsequent to that of FIGS. 11-13.
Figure 15:
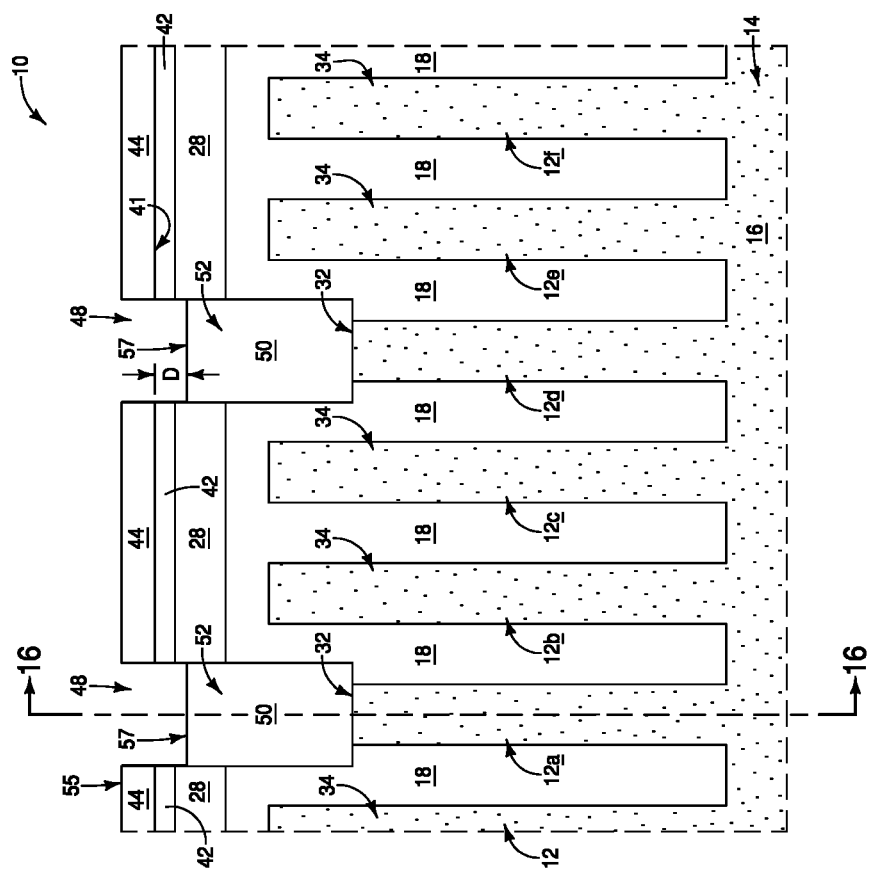
Figure 16:
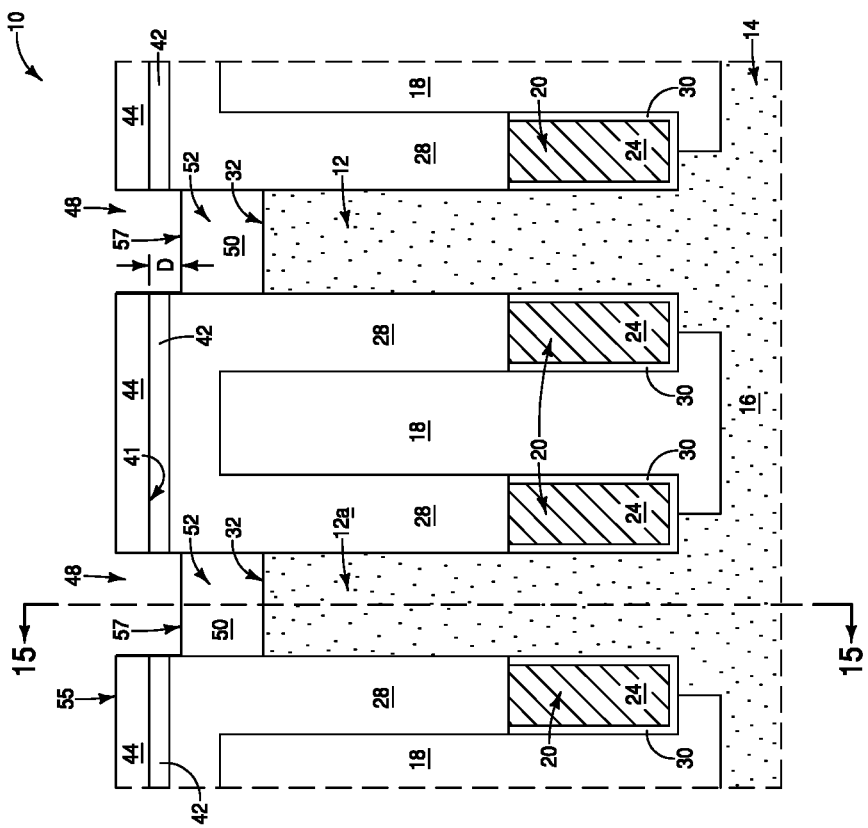

Referring to FIGS. 14-16, the conductive-semiconductor-material 50 is recessed within the openings 48. The conductive-semiconductor-material-interconnects 52 have uppermost surfaces 57, and such uppermost surfaces are recessed to a level below the level of the lower surface 41 of the non-conductive-semiconductor-material 44. FIG. 15 shows that the uppermost surface 57 of the recessed conductive-semiconductor-material 50 is below the lower surface 41 of the non-conductive-semiconductor-material 44 by a distance D. The distance D may be any suitable distance; and in some embodiments may be at least about 5 Å, at least about 10 Å, at least about 100 Å, etc. The recessing of the conductive-semiconductor-material 50 within the openings 48 eliminates contact between the conductive-semiconductor-material 50 and the non-conductive-semiconductor-material 44, which can eliminate transfer of dopant from the conductive-semiconductor-material 50 to the non-conductive-semiconductor-material 44. Accordingly, the conductivity of the conductive-semiconductor-material-interconnects 52 is not reduced due to loss of dopant to the material 44, and insulative properties of the material 44 are not altered due to diffusion of dopant into the material 44.

Figure 17:
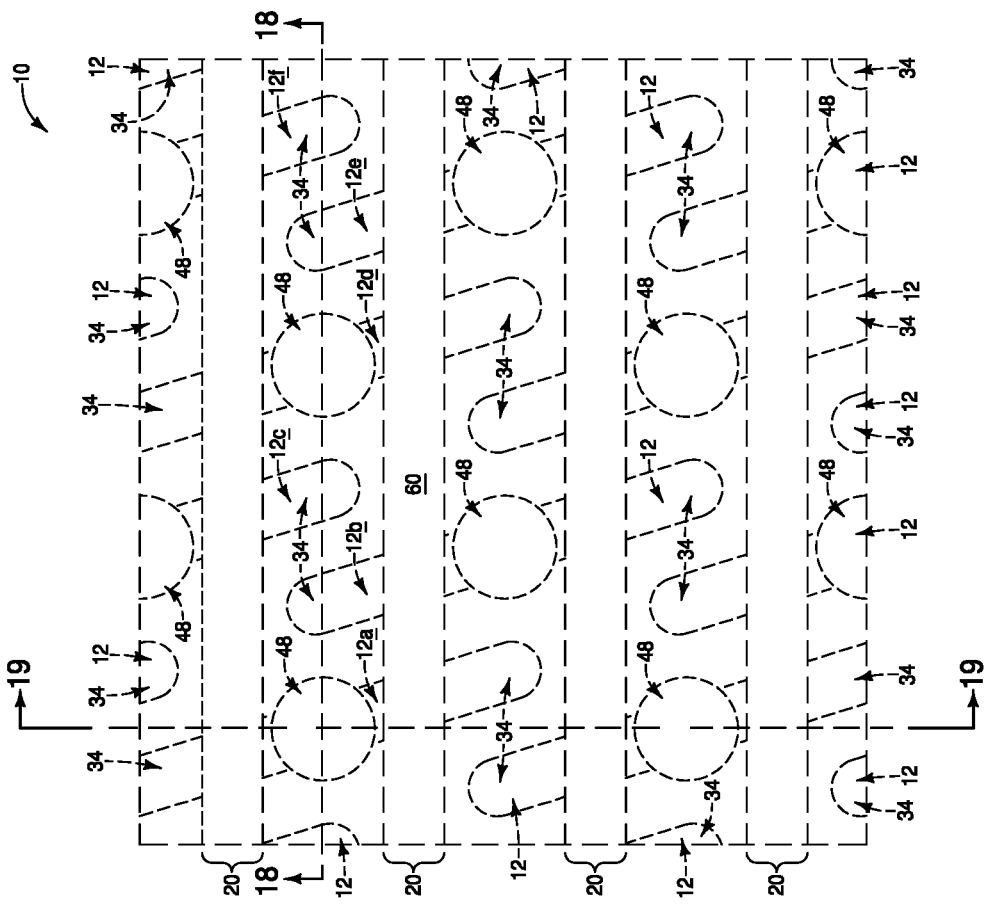
FIG. 17-19 are diagrammatic views of the region of the example construction of FIGS. 1-4 at an example processing stage subsequent to that of FIGS. 14-16.
Figure 18:
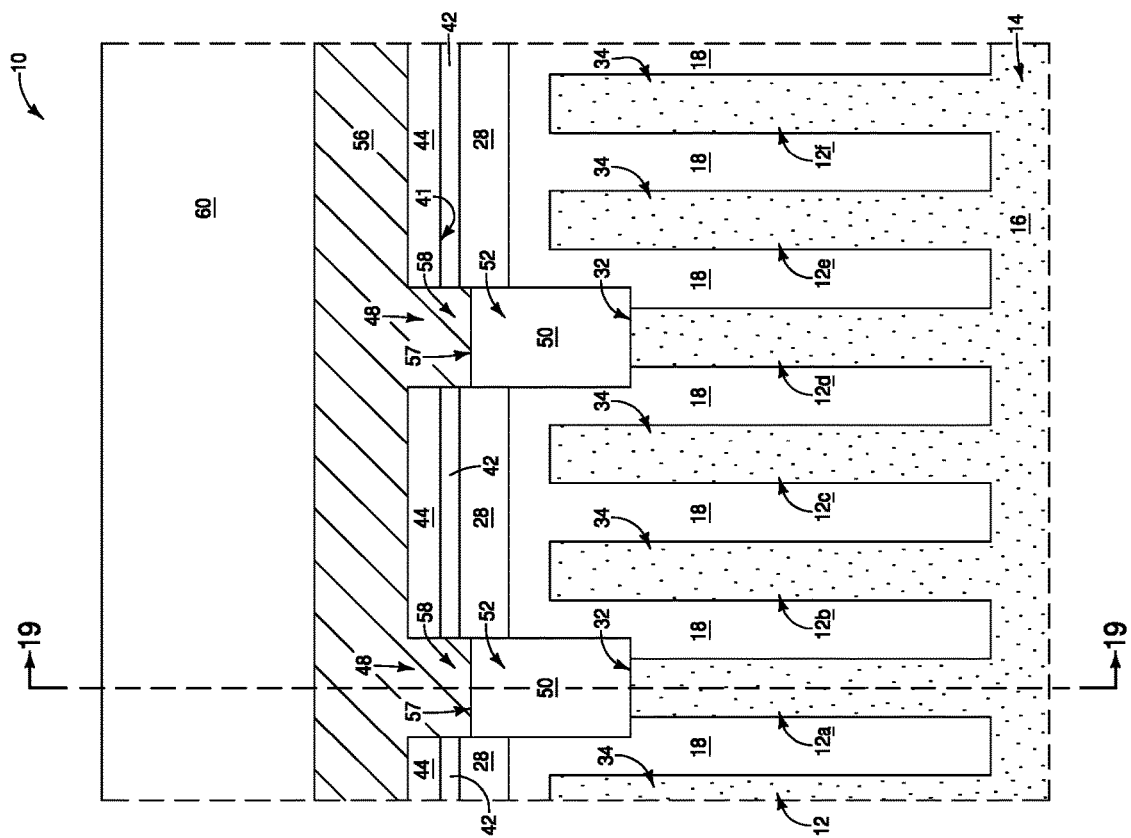
Figure 19:
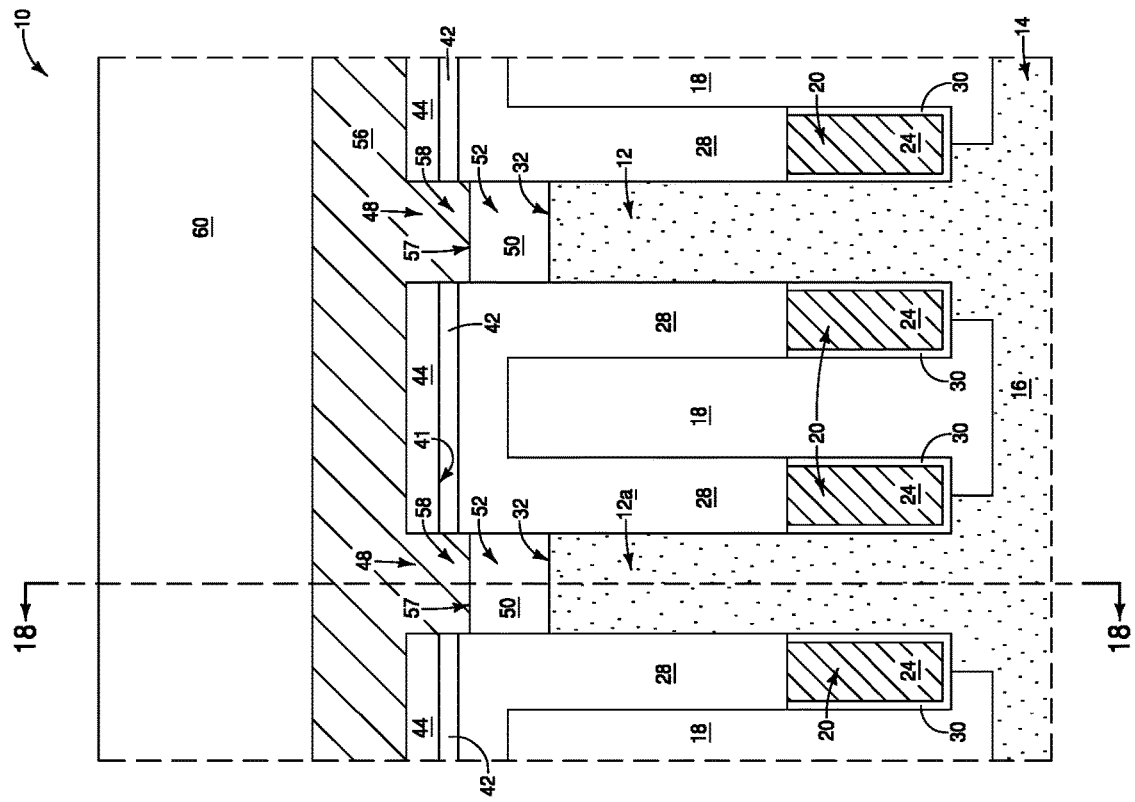

Referring to FIGS. 17-19, conductive-digit-line-material 56 is formed over the non-conductive-semiconductor-material 44 and within the openings 48. The conductive-digit-line-material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive-digit-line-material 56 may comprise metal (e.g., titanium, tungsten, titanium silicide, titanium nitride, tungsten silicide, tungsten nitride, etc.) and may be referred to as metal-containing-digit-line-material.

In some embodiments, regions of the digit-line-material 56 within the openings 48 may be referred to as conductive regions 58 (or conductive interconnects) which extend downwardly to electrically couple with the upper surfaces 57 of the conductive-semiconductor-material-interconnects 52.

Insulative material 60 is formed over the digit-line-material 56. The insulative material 60 may comprise any suitable composition(s); and in some embodiments may comprise, consist essentially of, or consist of silicon nitride.

Referring to FIGS. 20-22, the digit-line-material 56 is patterned into digit lines 22. In embodiments in which the digit-line-material 56 is a metal-containing material, the digit lines 22 may be referred to as metal-containing-digit-lines.

In the shown embodiment, the insulative material 60 is patterned into insulative capping structures 59 which extend along top surfaces of the digit lines 22.

The cross-section of FIG. 22 shows a digit-line-contact-region 32 having a first lateral thickness (i.e., width) $W_1$ and shows a conductive-semiconductor-material-interconnect having a second lateral thickness $W_2$. The second lateral thickness $W_2$ may be about the same as the first lateral thickness $W_1$ in some embodiments (with the term "about the same" meaning the same to within reasonable tolerances of fabrication and measurement), and may be different than the first lateral thickness in other embodiments. For instance, the second lateral thickness $W_2$ may be larger than the first lateral thickness in some embodiments, and may be smaller than the first lateral thickness in other embodiments.

In some embodiments, the active-region-material 16 may comprise a same composition as the conductive-semiconductor-material 50 (e.g., both may comprise conductively-doped silicon having the same dopant types and concentrations as one another), and accordingly the materials 16 and 50 may merge together into a single conductive structure. In other embodiments, the materials 16 and 50 may comprise different compositions relative to one another (e.g., may comprise different semiconductor compositions relative to one another, may comprise different dopant concentrations relative to one another and/or may comprise different dopant types relative to one another).

In some embodiments, the digit lines 22 may be considered to comprise segments 53 extending across the intervening regions 40 (with such intervening regions being shown in FIGS. 2 and 4, and being described above). Lower surfaces 61 of the digit lines 22 along the segments 53 directly contact an upper surface 63 of the non-conductive-semiconductor-material 44 in the illustrated embodiment of FIGS. 20-22 (as shown along the cross-sections of FIGS. 21 and 22).

The conductive interconnects 52 and 58 may be considered together to be configured as conductive plugs 52/58. In the embodiment of FIGS. 20-22, the digit-line-material 56 is directly against an upper surface of the non-conductive-semiconductor-material 44 across intervening regions between the conductive plugs 52/58 (with such intervening regions being analogous to the intervening regions 40 described above with reference to FIGS. 1-4). In other embodiments, one or more materials may be provided between the non-conductive-semiconductor-material 44 and the digit-line-material 56. An example of such other embodiments is described below with reference to FIGS. 25-29.

Figure 23:
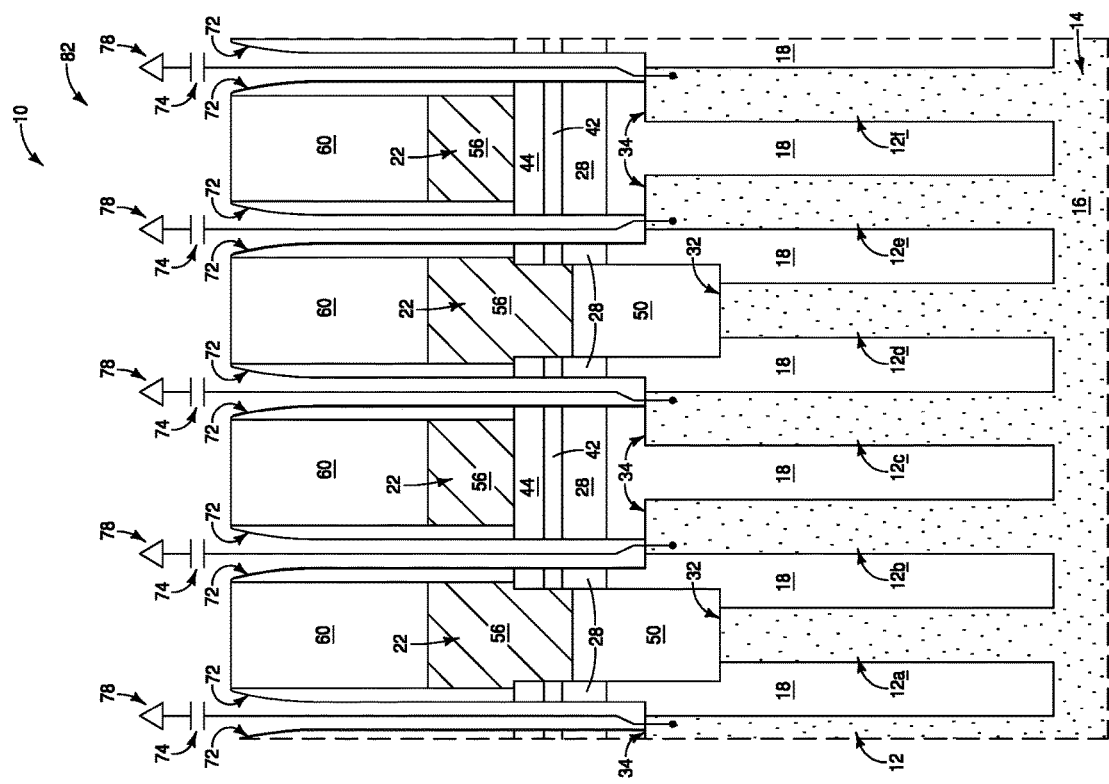
FIG. 23 is diagrammatic cross-sectional side view along the same cross-section as FIG. 21 at an example process stage which may follow the process stage of FIG. 21.

Referring next to FIG. 23, a region of construction 10 is shown at a processing stage following that of FIGS. 20-22; with such region being shown along the same cross-section as FIG. 21. The processing stage of FIG. 23 shows the charge-storage-device-contact-regions 34 exposed and coupled with example charge-storage-devices corresponding to capacitors 74. Each of the capacitors 74 has a node connected with a reference voltage 78. The reference voltage may be ground or any other suitable voltage.

In the shown embodiment, insulative-material-spacers 72 are provided along sidewalls of the digit lines 22. The spacers 72 may comprise any suitable composition(s); and in some embodiments may comprise, consist essentially of, or consist of one or both of silicon dioxide and silicon nitride.

The configuration of FIG. 23 may be considered to correspond to a region of a memory array 82 (for instance, a DRAM array). The memory array comprises memory cells which include an access transistor (e.g., a transistor comprising a gate along one of the wordlines 20, with the wordlines being shown in FIG. 22) coupled with a charge-storage device (e.g., a capacitor 74). An example memory array 82 is described with reference to FIG. 24. The memory array includes digit lines (DL1-DL4) corresponding to the digit lines 22, and includes wordlines (WL1-WL4) corresponding to the wordlines 20. Memory cells 80 comprise transistors coupled with the capacitors 74. Each of the memory cells 80 is uniquely addressed through the combination of a wordline and a digit line.

Figure 24:
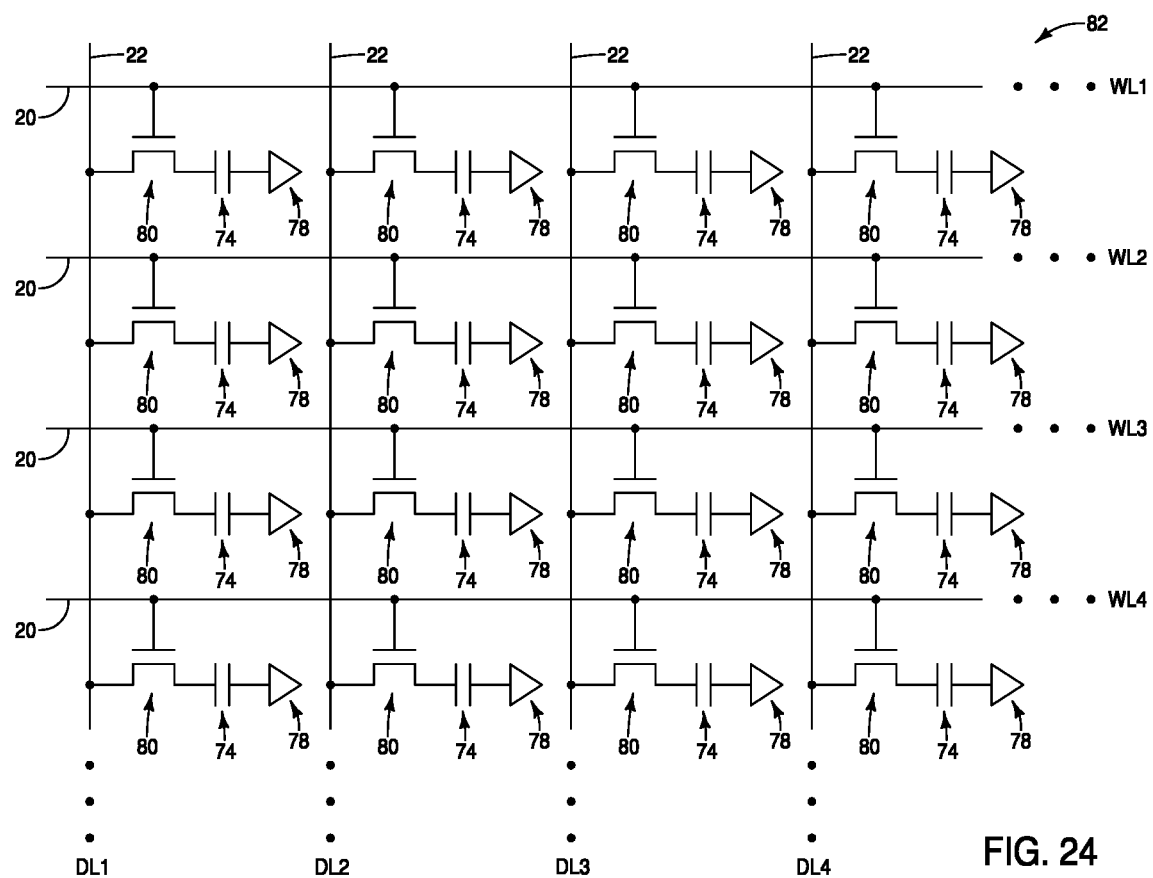
FIG. 24 is a diagrammatic schematic view of a region of an example memory array.

The memory array 82 of FIG. 24 is a DRAM array in which each of the memory cells 80 comprises a transistor and a capacitor. In other embodiments, configurations analogous to those described herein may be utilized in other memory arrays.

Figure 25:
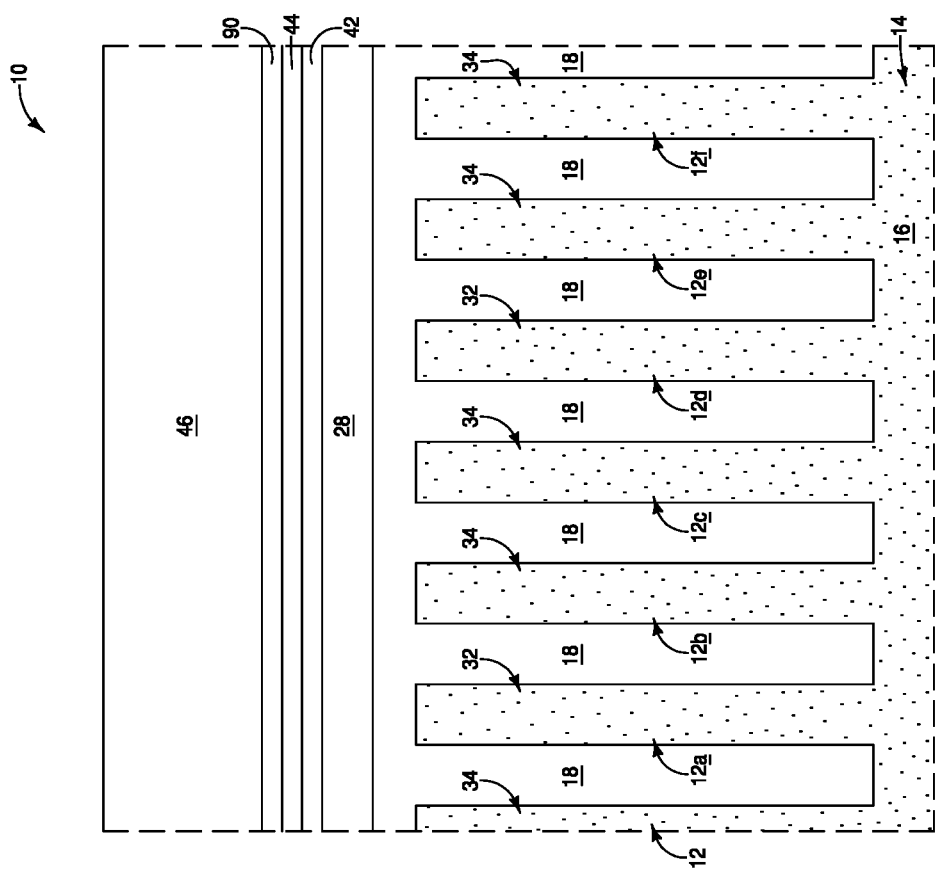
FIG. 25 is diagrammatic cross-sectional side view along the same cross-section as FIG. 2 at an example process stage which may be utilized alternatively to that of FIG. 2.

The methodology described above forms the insulative material 46 directly against an upper surface of the non-conductive-semiconductor-material 44, and planarizes down to an upper surface of the non-conductive-semiconductor-material 44 at the processing stage of FIGS. 11-13. In other embodiments, protective material may be provided over the non-conductive-semiconductor-material 44 to protect the material 44 during the planarization. Further, the protective material may be "harder" then the material 44 and may thus provide a better stopping point for the planarization process. FIG. 25 shows a region of construction 10 at a processing stage analogous to that of FIGS. 1-4 in accordance with an embodiment in which a protective material 90 is provided between the non-conductive-semiconductor-material 44 and the insulative material 46. The illustrated region of FIG. 25 is shown along the same cross-section as FIG. 2.

The protective material 90 may comprise any suitable composition(s); and in some embodiments may comprise, consist essentially of, or consist of silicon nitride. The protective material 90 is formed over the non-conductive-semiconductor-material 44, and may be formed with any suitable processing. Subsequently, the insulative material 46 is formed over the protective material 90.

Figure 26:
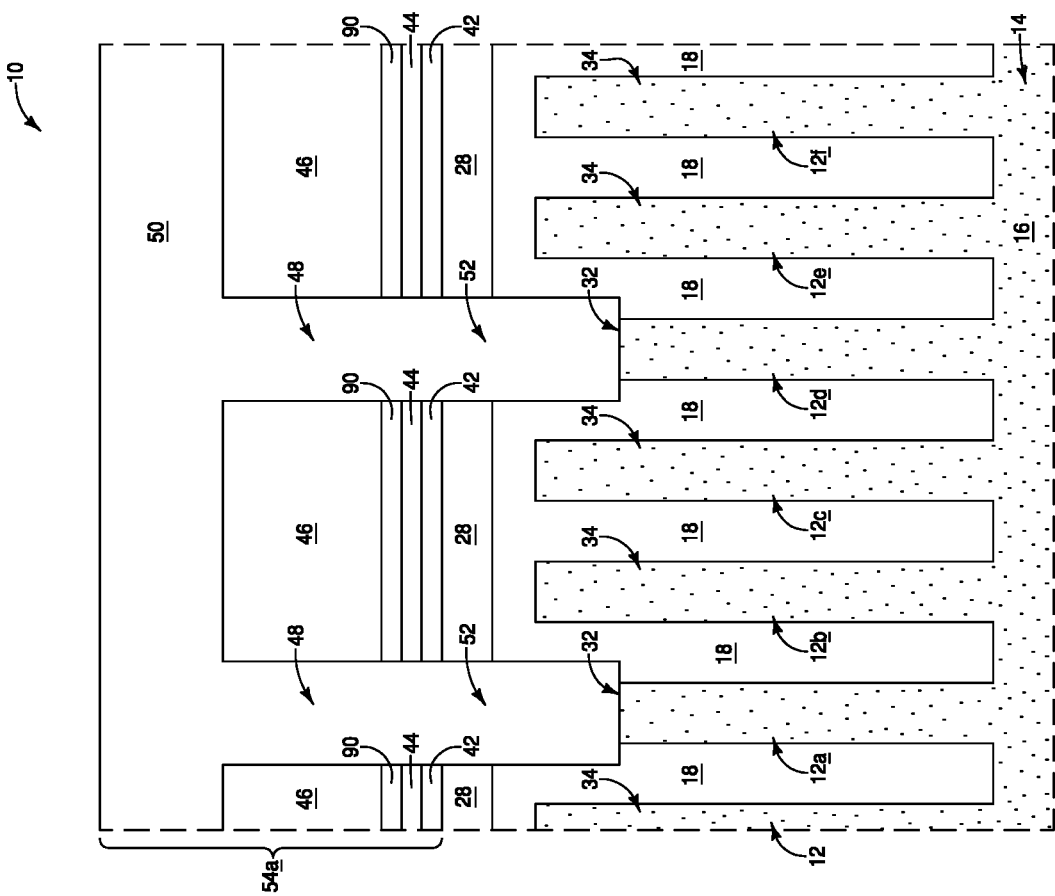
FIGS. 26-30 are diagrammatic cross-sectional views of the construction of FIG. 25 at example process stages which may follow the process stage of FIG. 25.

Referring to FIG. 26, the construction 10 is shown at a processing stage subsequent to that of FIG. 25, and analogous to that of FIG. 9. The openings 48 have been formed through the materials 46, 90, 44 and 42; and the conductive-semiconductor-material 50 has been formed across the insulative 46 and within the openings 48. The materials 42, 44, 90, 46 and 50 may be considered together to be a subassembly (or stack) 54a analogous to the subassembly 54 shown in FIG. 9.

Figure 27:
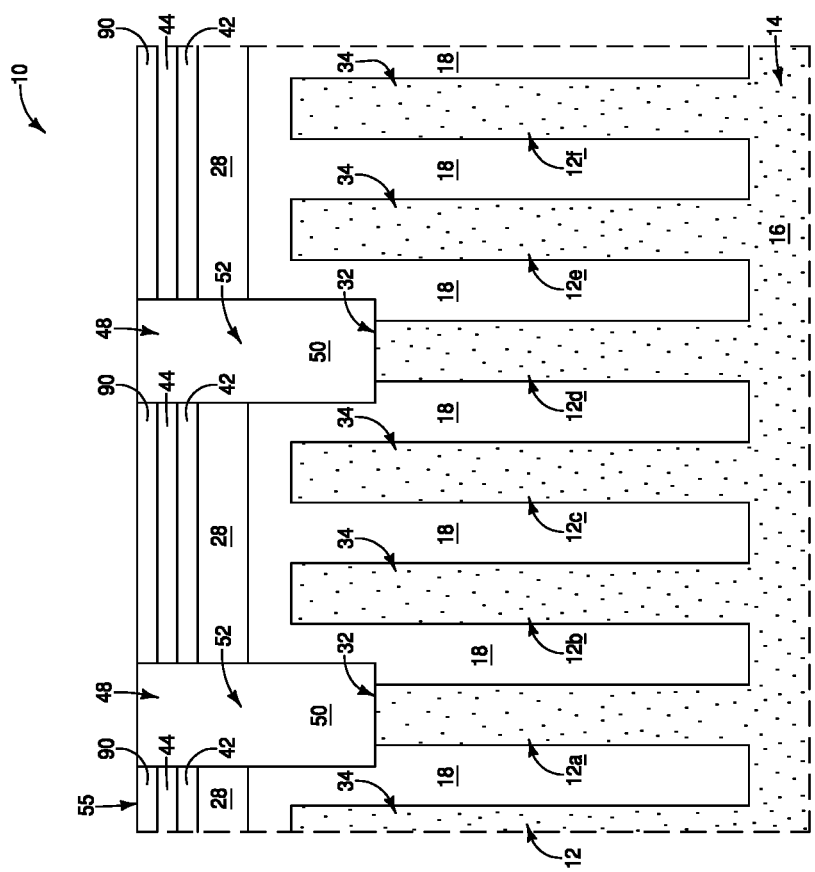

Referring to FIG. 27, the construction 10 is shown at a processing stage subsequent to that of FIG. 26, and analogous to that of FIG. 12. The assembly 54a (FIG. 26) is subjected to planarization to form a planarized upper surface 55 extending across the protective material 90 and the conductive-semiconductor-material 50.

Figure 28:
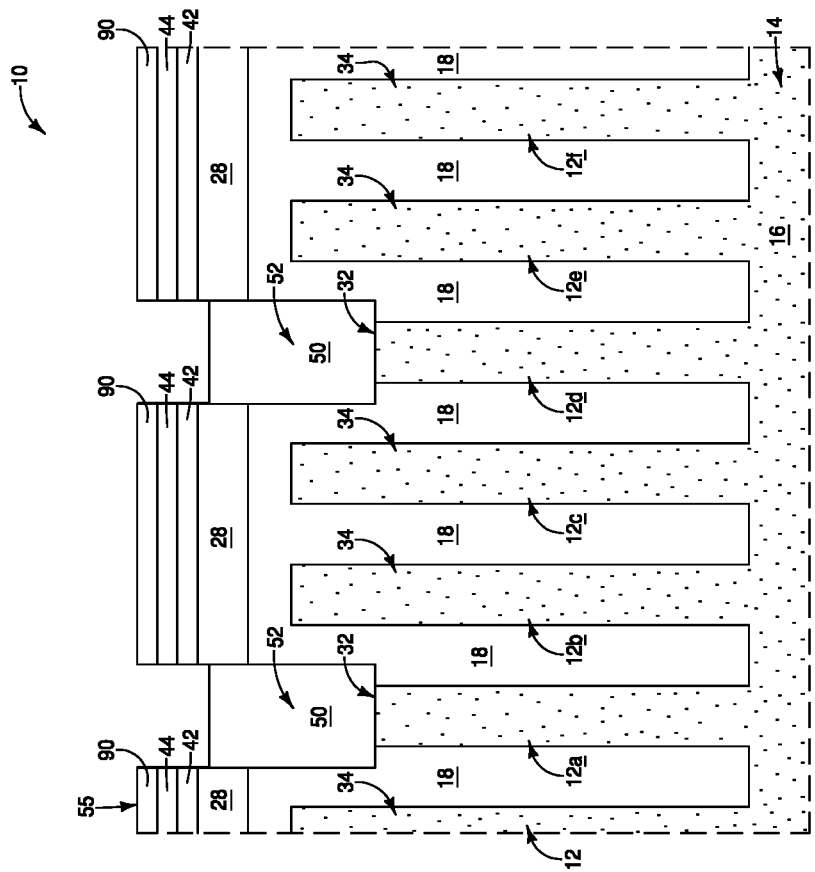

Referring to FIG. 28, the construction 10 is shown at a processing stage subsequent to that of FIG. 27 and analogous to that of FIG. 15. The conductive-semiconductormaterial 50 is recessed within the openings 48. The protective material 90 may or may not be removed. If the protective material 90 is removed, such removal may occur before or after the recessing of the conductive-semiconductor-material 50. The process stage of FIG. 28 is an example process stage in which the protective material 90 remains after the recessing of the conductive-semiconductor-material 50.

Figure 29:
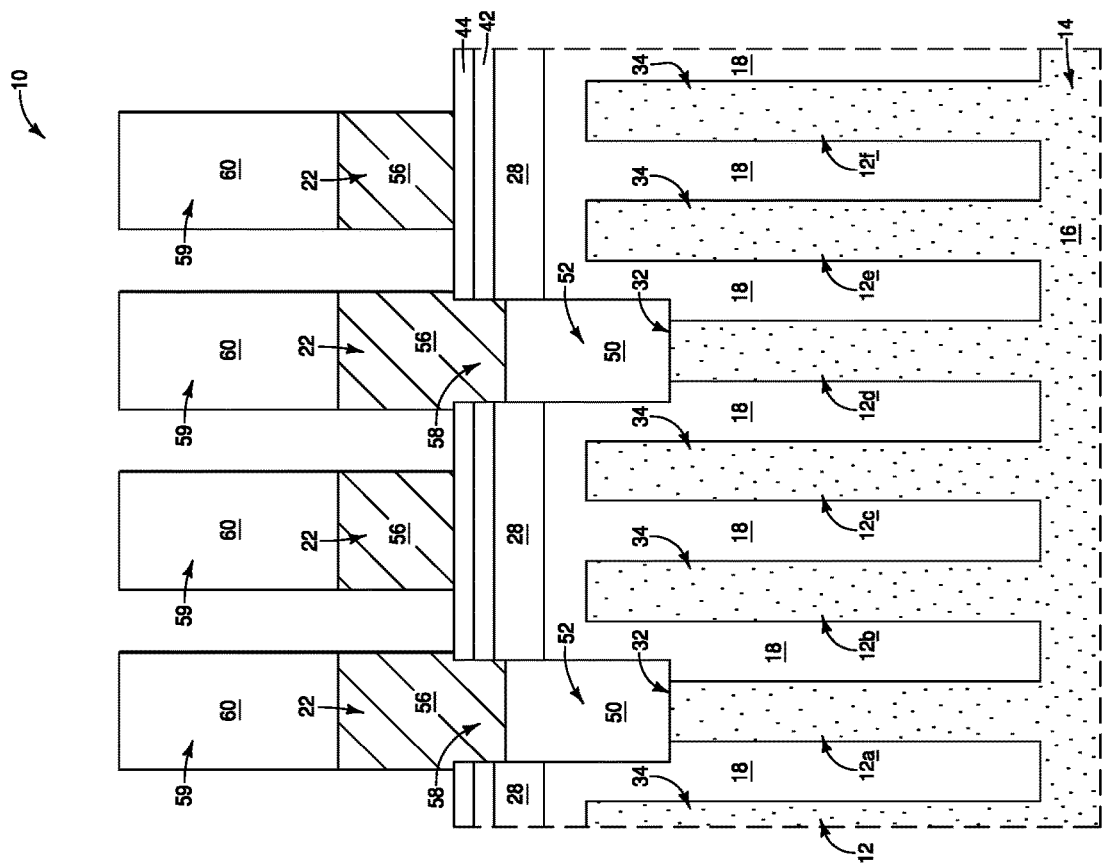

Referring to FIG. 29, the construction 10 is shown at a processing stage subsequent to that of FIG. 28 and identical to that of FIG. 21. The protective material 90 (FIG. 28) has been removed, and the patterned digit-line-material 56 and insulative material 60 are formed to extend across the construction; with the patterned digit-line-material 56 being configured as the digit lines 22. The construction of FIG. 29 may be subsequently processed to form memory structures and arrays of the types described above with reference to FIGS. 23 and 24.

Figure 30:
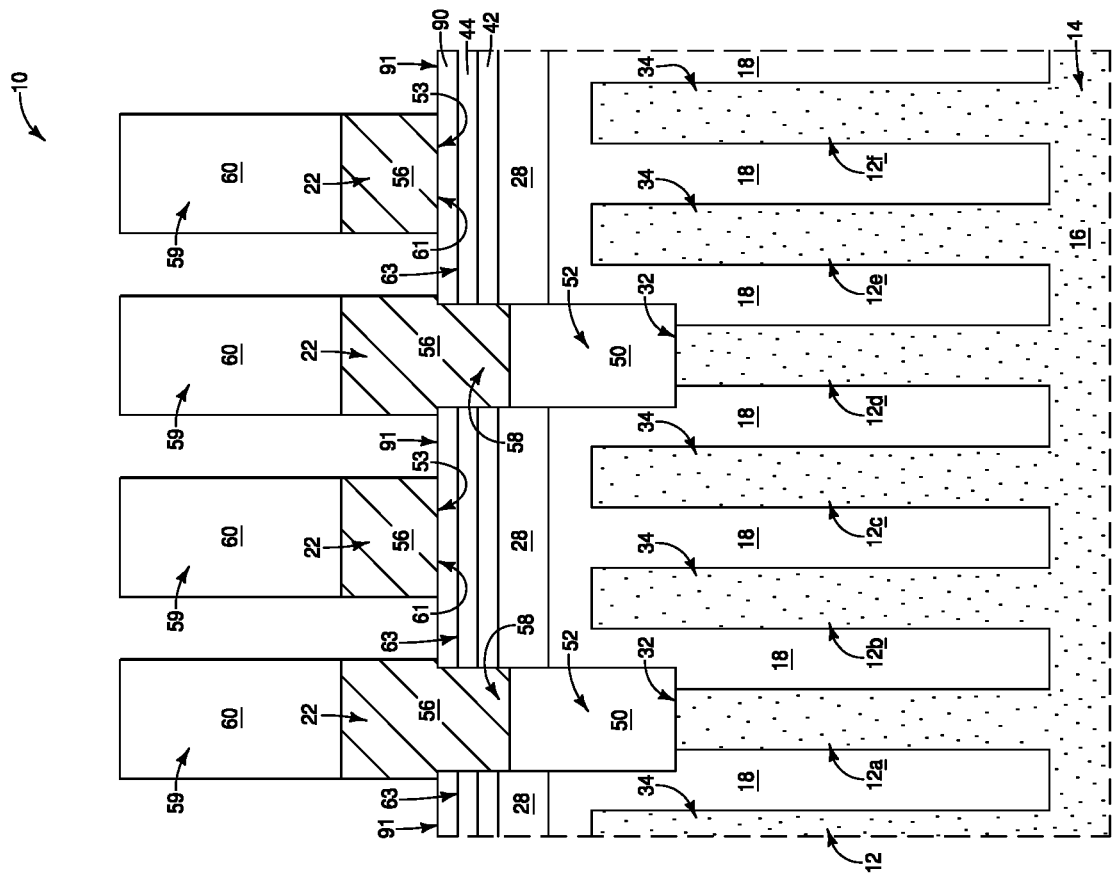

In some embodiments, the protective material 90 may not be removed, but may instead remain in a final construction. FIG. 30 shows construction 10 at a processing stage analogous to that of FIG. 29, but in accordance with an embodiment in which the protective material 90 remains between the non-conductive-semiconductor-material 44 and the digit-line-material 56. In the embodiment of FIG. 30, the digit lines 22 have the segments 53 along the intervening regions between the spaced-apart digit-line-contact regions 32, analogous to the segments 53 described above with reference to FIGS. 20-22. However, in contrast to the embodiment described above with reference to FIGS. 20-22, the embodiment of FIG. 30 has lower surfaces 61 of the digit-line-segments 53 directly against an upper surface 91 the protective material 90. In some embodiments, the protective material 90 may be representative of one or more insulative materials provided between lower surfaces 61 of the segments 53 and the upper surface 63 of the non-conductive-semiconductor-material 44.

The construction of FIG. 30 may be subsequently processed to form memory structures and arrays of the types described above with reference to FIGS. 23 and 24.

The methods and configurations described above pertain to DRAM. However, it is to be understood that the methods and configurations may be extended to any suitable applications; with example suitable applications including, but not being limited to, DRAM.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A construction is provided to have laterally-spaced digit-line-contact-regions, and to have intervening regions between the laterally-spaced digit-line-contact-regions. An expanse of non-conductive-semiconductor-material is formed to extend across the digit-line-contact-regions and the intervening regions. A lower surface of the non-conductive-semiconductor-material is vertically-spaced from upper surfaces of the digit-line-contact-regions. Openings are formed to extend through the non-conductive-semiconductor-material to the digit-line-contact-regions. Conductive-semiconductor-material-interconnects are formed within the openings and are coupled with the digit-line-contact-regions. Upper surfaces of the conductive-semiconductor-material-interconnects are beneath the lower surface of the non-conductive-semiconductor-material. Metal-containing-digit-lines are formed over the non-conductive-semiconductor-material, with conductive regions extending downwardly from the metal-containing-digit-lines to couple with the conductive-semiconductor-material-interconnects.

Some embodiments include a method of forming an integrated assembly. A construction is provided to have laterally-spaced digit-line-contact-regions, and to have intervening regions between the laterally-spaced digit-line-contact-regions. A first insulative material is formed to extend across the digit-line-contact-regions and across the intervening regions. A non-conductive-semiconductor-material is formed over the first insulative material. A second insulative material is formed over the non-conductive-semiconductor-material. Openings are formed to extend through the second insulative material, the non-conductive-semiconductor-material and the first insulative material to the digit-line-contact-regions. Conductive-semiconductor-material is formed over the second insulative material and within the openings. The conductive-semiconductor-material within the openings electrically couples with the digit-line-contact-regions. The first insulative material, non-conductive-semiconductor-material, second insulative material and conductive-semiconductor-material together form a subassembly. An upper surface of the subassembly is planarized to remove the second insulative material and the conductive-semiconductor-material from over the non-conductive-semiconductor-material. The planarized upper surface extends across the non-conductive-semiconductor-material and the conductive-semiconductor-material. The conductive-semiconductor-material within the openings is recessed after the planarizing until an upper surface of the conductive-semiconductor-material is below a level of a lower surface of the non-conductive-semiconductor-material. Metal-containing-digit-lines are formed over the non-conductive-semiconductor-material, with conductive regions extending downwardly from the metal-containing-digit-lines to electrically couple with the recessed conductive-semiconductor-material.

Some embodiments include a method of forming an integrated assembly. A construction is provided to have laterally-spaced digit-line-contact-regions, and to have intervening regions between the laterally-spaced digit-line-contact-regions. A first insulative material is formed to extend across the digit-line-contact-regions and across the intervening regions. A non-conductive-semiconductor-material is formed over the first insulative material. A protective material is formed over the non-conductive-semiconductor-material. A second insulative material is formed over the protective material. Openings are formed to extend through the second insulative material, the protective material, the non-conductive-semiconductor-material and the first insulative material to the digit-line-contact-regions. Conductive-semiconductor-material is formed over the second insulative material and within the openings. The conductive-semiconductor-material within the openings electrically couples with the digit-line-contact-regions. The first insulative material, non-conductive-semiconductor-material, protective material, second insulative material and conductive-semiconductor-material together form a subassembly. An upper surface of the subassembly is planarized to remove the second insulative material and the conductive-semiconductor-material from over the protective material. The planarized upper surface extends across the protective material and the conductive-semiconductor-material. The conductive-semiconductor-material is recessed within the openings after the planarizing, until an upper surface of the conductive-semiconductor-material is below a level of a lower surface of the non-conductive-semiconductor-material. Metal-containing-digit-lines are formed over the non-conductive-semiconductor-material, with conductive regions extending downwardly from the metal-containing-digit-lines to electrically couple with the recessed conductive-semiconductor-material.

Some embodiments include an integrated assembly which has laterally-spaced digit-line-contact-regions. The digit-line-contact-regions are comprised by pillars of active-region-material. Intervening regions are between the laterally-spaced digit-line-contact-regions. Non-conductive-semiconductor-material is over the intervening regions. Openings extend through the non-conductive-semiconductor-material to the digit-line-contact-regions. A lower surface of the non-conductive-semiconductor-material is vertically-spaced from upper surfaces of the digit-line-contact-regions. Conductive-semiconductor-material-interconnects are within the openings and are coupled with the digit-line-contact-regions. Upper surfaces of the conductive-semiconductor-material-interconnects are beneath the lower surface of the non-conductive-semiconductor-material. Metal-containing-digit-lines are over the non-conductive-semiconductor-material. Conductive regions extend downwardly from the metal-containing-digit-lines to couple with the conductive-semiconductor-material-interconnects.

Some embodiments include an integrated assembly which has an access transistor including a digit-line-contact-region; non-conductive-semiconductor-material over the access transistor, the non-conductive-semiconductor-material including an opening that is vertically aligned with the digit-line-contact-region; and a digit line over the non-conductive-semiconductor-material, the digit line including a conductive interconnect protruding from a part of the digit line toward the digit-line-contact-region. Each of the digit line and the conductive interconnect comprises metal. The conductive interconnect penetrates through the opening and is in electrical contact with the digit-line-contact-region.

Some embodiments include an integrated assembly which has an integrated assembly which has comprising: a plurality of access transistors, each of the plurality of access transistor including a digit-line-contact-region; non-conductive material over the plurality of access transistors, the non-conductive material comprising insulative material and non-conductive-semiconductor-material over the insulative material, the non-conductive material including a plurality of openings to expose at least one part of the digit-line-contact-region of an associated one of the plurality of access transistors; a plurality of conductive-semiconductor-material-interconnects each in an associated one of the plurality of openings to make an electrical contact with the at least one part of the digit-line-contact-region of an associated one of the plurality of access transistors, each of the plurality of conductive-semiconductor-material-interconnects being recessed to leave a part of an associated one of the plurality of openings so that each of the plurality of conductive-semiconductor-material-interconnects is free from being contact with the non-conductive-semiconductor-material; and at least one digit line over the non-conductive material, the at least one digit line including a plurality of conductive interconnects each protruded downwardly to fill the part of an associated one of the plurality of openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
providing a construction having laterally-spaced digit-line-contact-regions, and having intervening regions between the laterally-spaced digit-line-contact-regions;
forming an expanse of non-conductive-semiconductor-material which extends across the digit-line-contact-regions and the intervening regions; a lower surface of the non-conductive-semiconductor-material being vertically-spaced from upper surfaces of the digit-line-contact-regions;
forming openings extending through the non-conductive-semiconductor-material to the digit-line-contact-regions;
forming conductive-semiconductor-material-interconnects within the openings and coupled with the digitline-contact-regions, upper surfaces of the conductive-semiconductor-material-interconnects being beneath the lower surface of the non-conductive-semiconductor-material; and forming metal-containing-digit-lines over the non-conductive-semiconductor-material, with conductive regions extending downwardly from the metal-containing-digit-lines to couple with the conductive-semiconductor-material-interconnects.

2. The method of claim 1 wherein the upper surfaces of the conductive-semiconductor-material-interconnects are beneath the lower surface of the non-conductive-semiconductor-material by at least about 5 Å.

3. The method of claim 1 wherein the upper surfaces of the conductive-semiconductor-material-interconnects are beneath the lower surface of the non-conductive-semiconductor-material by at least about 10 Å.

4. The method of claim 1 wherein the non-conductive-semiconductor-material and the conductive-semiconductor-material-interconnects comprise a same semiconductor composition as one another.

5. The method of claim 4 wherein said same semiconductor composition comprises silicon.

6. The method of claim 1 wherein the non-conductive-semiconductor-material and the conductive-semiconductor-material-interconnects comprise different semiconductor compositions relative to one another.

7. The method of claim 1 wherein segments of the metal-containing-digit-lines extend across the intervening regions; and wherein said segments have lower surfaces directly against an upper surface of the non-conductive-semiconductor-material.

8. The method of claim 1 wherein segments of the metal-containing-digit-lines extend across the intervening regions; and further comprising providing insulative material between lower surfaces of said segments and an upper surface of the non-conductive-semiconductor-material.

9. The method of claim 8 wherein said insulative material comprises silicon nitride.

10. A method of forming an integrated assembly, comprising:
   providing a construction having laterally-spaced digit-line-contact-regions, and having intervening regions between the laterally-spaced digit-line-contact-regions;
   forming a first insulative material extending across the digit-line-contact-regions and across the intervening regions;
   forming a non-conductive-semiconductor-material over the first insulative material;
   forming a second insulative material over the non-conductive-semiconductor-material;
   forming openings extending through the second insulative material, the non-conductive-semiconductor-material and the first insulative material to the digit-line-contact-regions;
   forming conductive-semiconductor-material over the second insulative material and within the openings; the conductive-semiconductor-material within the openings coupling with the digit-line-contact-regions; the first insulative material, the non-conductive-semiconductor-material, the second insulative material and the conductive-semiconductor-material together forming a subassembly;
   planarizing an upper surface of the subassembly to remove the second insulative material and the conductive-semiconductor-material from over the non-conductive-semiconductor-material; the planarized upper surface extending across the non-conductive-semiconductor-material and the conductive-semiconductor-material;
   after the planarizing, recessing the conductive-semiconductor-material within the openings until an upper surface of the conductive-semiconductor-material is below a level of a lower surface of the non-conductive-semiconductor-material; and
   forming metal-containing-digit-lines over the non-conductive-semiconductor-material, with conductive regions extending downwardly from the metal-containing-digit-lines to couple with the recessed conductive-semiconductor-material.

11. The method of claim 10 wherein the non-conductive-semiconductor-material comprises silicon.

12. The method of claim 11 wherein the conductive-semiconductor-material comprises silicon.

13. The method of claim 12 wherein the first insulative material comprises silicon nitride.

14. The method of claim 13 wherein the second insulative material comprises silicon dioxide.

15. The method of claim 10 wherein the recessing recesses the upper surface of the conductive-semiconductor-material to at least about 5 Å below the level of the lower surface of the non-conductive-semiconductor-material.

16. The method of claim 10 wherein the recessing recesses the upper surface of the conductive-semiconductor-material to at least about 10 Å below the level of the lower surface of the non-conductive-semiconductor-material.

17. The method of claim 10 wherein the recessing recesses the upper surface of the conductive-semiconductor-material to at least about 100 Å below the level of the lower surface of the non-conductive-semiconductor-material.

18. The method of claim 10 wherein the construction comprises charge-storage-device-contact-regions gatedly coupled with the digit-line-contact-regions; and further comprising forming charge-storage-devices coupled with the charge-storage-device-contact-regions.

19. A method of forming an integrated assembly, comprising:
   providing a construction having laterally-spaced digit-line-contact-regions, and having intervening regions between the laterally-spaced digit-line-contact-regions;
   forming a first insulative material extending across the digit-line-contact-regions and across the intervening regions;
   forming a non-conductive-semiconductor-material over the first insulative material;
   forming a protective material over the non-conductive-semiconductor-material;
   forming a second insulative material over the protective material;
   forming openings extending through the second insulative material, the protective material, the non-conductive-semiconductor-material and the first insulative material to the digit-line-contact-regions;
   forming conductive-semiconductor-material over the second insulative material and within the openings; the conductive-semiconductor-material within the openings coupling with the digit-line-contact-regions; the first insulative material, the non-conductive-semiconductor-material, the protective material, the second insulative material and the conductive-semiconductor-material together forming a subassembly;
   planarizing an upper surface of the subassembly to remove the second insulative material and the conductive-semiconductor-material from over the protective material; the planarized upper surface extending across the protective material and the conductive-semiconductor-material;

after the planarizing, recessing the conductive-semiconductor-material within the openings until an upper surface of the conductive-semiconductor-material is below a level of a lower surface of the non-conductive-semiconductor-material; and forming metal-containing-digit-lines over the non-conductive-semiconductor-material, with conductive regions extending downwardly from the metal-containing-digit-lines to couple with the recessed conductive-semiconductor-material.

20. The method of claim 19 wherein the protective material comprises silicon nitride.

21. The method of claim 19 further comprising removing the protective material prior to forming the metal-containing-digit-lines.

22. The method of claim 19 wherein the metal-containing-digit-lines are formed over the protective material.

23. The method of claim 19 wherein the construction comprises charge-storage-device-contact-regions gatedly coupled with the digit-line-contact-regions; and further comprising forming charge-storage-devices coupled with the charge-storage-device-contact-regions.

24. The method of claim 19 wherein the first insulative material comprises silicon nitride.

25. The method of claim 19 wherein the second insulative material comprises silicon dioxide.

26. The method of claim 19 wherein the recessing recesses the upper surface of the conductive-semiconductor-material to at least about 5 Å below the level of the lower surface of the non-conductive-semiconductor-material.

27. The method of claim 19 wherein the recessing recesses the upper surface of the conductive-semiconductor-material to at least about 10 Å below the level of the lower surface of the non-conductive-semiconductor-material.

* * * * *